(12) United States Patent
Kita

(10) Patent No.: US 9,581,811 B2
(45) Date of Patent: Feb. 28, 2017

(54) METHOD FOR EVALUATING AND IMPROVING PUPIL LUMINANCE DISTRIBUTION, ILLUMINATION OPTICAL SYSTEM AND ADJUSTMENT METHOD THEREOF, EXPOSURE APPARATUS, EXPOSURE METHOD, AND DEVICE MANUFACTURING METHOD

(71) Applicant: NIKON CORPORATION, Tokyo (JP)

(72) Inventor: Naonori Kita, Saitama (JP)

(73) Assignee: NIKON CORPORATION, Tokyo (JP)

( * ) Notice: Subject to any disclaimer, the term of this patent is extended or adjusted under 35 U.S.C. 154(b) by 249 days.

(21) Appl. No.: 14/398,245

(22) PCT Filed: Apr. 30, 2013

(86) PCT No.: PCT/JP2013/062554
§ 371 (c)(1),
(2) Date: Mar. 13, 2015

(87) PCT Pub. No.: WO2013/164997
PCT Pub. Date: Nov. 7, 2013

(65) Prior Publication Data
US 2015/0323786 A1    Nov. 12, 2015

(30) Foreign Application Priority Data

May 2, 2012 (JP) .................... 2012-105220
Feb. 6, 2013 (JP) .................... 2013-021099

(51) Int. Cl.
*G01J 1/00* (2006.01)
*G02B 27/00* (2006.01)
(Continued)

(52) U.S. Cl.
CPC .......... *G02B 27/0012* (2013.01); *G01M 11/02* (2013.01); *G02B 27/0927* (2013.01);
(Continued)

(58) Field of Classification Search
CPC ...... H01L 21/027; G03F 7/20; G03F 7/70116; G03F 7/70625
(Continued)

(56) References Cited

U.S. PATENT DOCUMENTS 5,312,513 A    5/1994    Florence et al.
5,867,302 A    2/1999    Fleming
(Continued)

FOREIGN PATENT DOCUMENTS

CN    101006552 A    7/2007
CN    101743497 A    6/2010
(Continued)

OTHER PUBLICATIONS

Jul. 23, 2013 International Search Report issued in International Application No. PCT/JP2013/062554.
(Continued)

*Primary Examiner* — Tarifur Chowdhury
*Assistant Examiner* — Isiaka Akanbi
(74) *Attorney, Agent, or Firm* — Oliff PLC

(57) ABSTRACT

Improvement of pupil luminance distribution includes: a fifth process in which an index value obtained from the illumination pupil, using evaluation method of a first process to fourth process; a sixth process wherein a unit change amount of the index value in the discrete data acquired in the previous process is acquired for each unit pupil area; a seventh process wherein discrete data modulated by an improving technique using the unit change amount so that the index value nears a target index value is acquired; and an eighth process wherein an index value obtained corresponding to the modulated discrete data in the seventh process is acquired, using the evaluation method of the first process to the fourth process, and by repeatedly performing the sixth process to eighth process so an error of the index value
(Continued)

obtained corresponding to the modulated discrete data falls within permissible range.

49 Claims, 19 Drawing Sheets

(51) Int. Cl.
| | |
|---|---|
| *G02B 27/09* | (2006.01) |
| *G01M 11/02* | (2006.01) |
| *G03F 7/20* | (2006.01) |
| *G03F 7/40* | (2006.01) |
| *G02B 26/08* | (2006.01) |

(52) U.S. Cl.
CPC ........... *G02B 27/0933* (2013.01); *G03F 7/40* (2013.01); *G03F 7/70116* (2013.01); *G03F 7/70133* (2013.01); *G03F 7/70141* (2013.01); *G03F 7/70216* (2013.01); *G02B 26/0833* (2013.01)

(58) Field of Classification Search
USPC . 356/121, 237.2; 348/280, 302, 349; 355/67
See application file for complete search history.

(56) References Cited

U.S. PATENT DOCUMENTS

| | | | |
|---|---|---|---|
| 5,925,887 A * | 7/1999 | Sakai | G03F 7/70133 |
| | | | 250/205 |
| 6,480,320 B2 | 11/2002 | Nasiri | |
| 6,600,591 B2 | 7/2003 | Anderson et al. | |
| 6,733,144 B2 | 5/2004 | Kwon | |
| 6,885,493 B2 | 4/2005 | Ljungblad et al. | |
| 6,891,655 B2 | 5/2005 | Grebinski et al. | |
| 6,900,915 B2 | 5/2005 | Nanjyo et al. | |
| 6,913,373 B2 | 7/2005 | Tanaka et al. | |
| 7,023,610 B2 | 4/2006 | Ohtsuki et al. | |
| 7,095,546 B2 | 8/2006 | Mala et al. | |
| 7,295,726 B1 | 11/2007 | Milanovic et al. | |
| 7,424,330 B2 | 9/2008 | Duerr et al. | |
| 7,567,375 B2 | 7/2009 | Enoksson et al. | |
| 2005/0095749 A1 | 5/2005 | Krellmann et al. | |
| 2006/0170901 A1 | 8/2006 | Tanitsu et al. | |
| 2007/0146676 A1 | 6/2007 | Tanitsu et al. | |
| 2007/0296936 A1 | 12/2007 | Kato et al. | |
| 2008/0030707 A1 | 2/2008 | Tanaka et al. | |
| 2008/0309901 A1 | 12/2008 | Rene Soemers et al. | |
| 2010/0020302 A1 | 1/2010 | Freimann | |
| 2010/0316943 A1* | 12/2010 | Tanitsu | G02B 17/0892 |
| | | | 430/30 |
| 2011/0181852 A1 | 7/2011 | Bleidistel et al. | |
| 2011/0188017 A1 | 8/2011 | Horn et al. | |
| 2011/0205514 A1* | 8/2011 | Kita | G03F 7/70591 |
| | | | 355/67 |
| 2012/0013915 A1 | 1/2012 | Okamura et al. | |
| 2012/0133915 A1* | 5/2012 | Matsuyama | G03F 7/70116 |
| | | | 355/67 |

FOREIGN PATENT DOCUMENTS

| | | |
|---|---|---|
| EP | 0779530 A1 | 6/1997 |
| EP | 1798758 A1 | 6/2007 |
| JP | H06-124873 A | 5/1994 |
| JP | H10-303114 A | 11/1998 |
| JP | 2000019012 A | 1/2000 |
| JP | 2004304135 A | 10/2004 |
| JP | 2006113437 A | 4/2006 |
| JP | 2011102109 A | 5/2011 |
| WO | 99/49504 A1 | 9/1999 |
| WO | 2006080285 A1 | 8/2006 |
| WO | 2009/035129 A2 | 3/2009 |
| WO | 2011/102109 A1 | 8/2011 |

OTHER PUBLICATIONS

Jul. 23, 2013 Written Opinion issued in International Application No. PCT/JP2013/062554.

Jul. 5, 2016 Office Action issued in Chinese Patent Application No. 201380033974.3.

* cited by examiner

Fig. 9
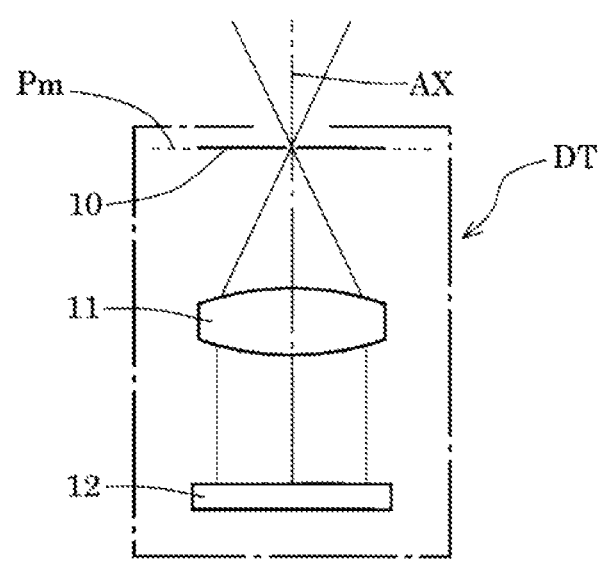
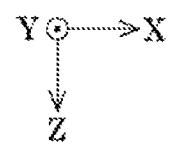

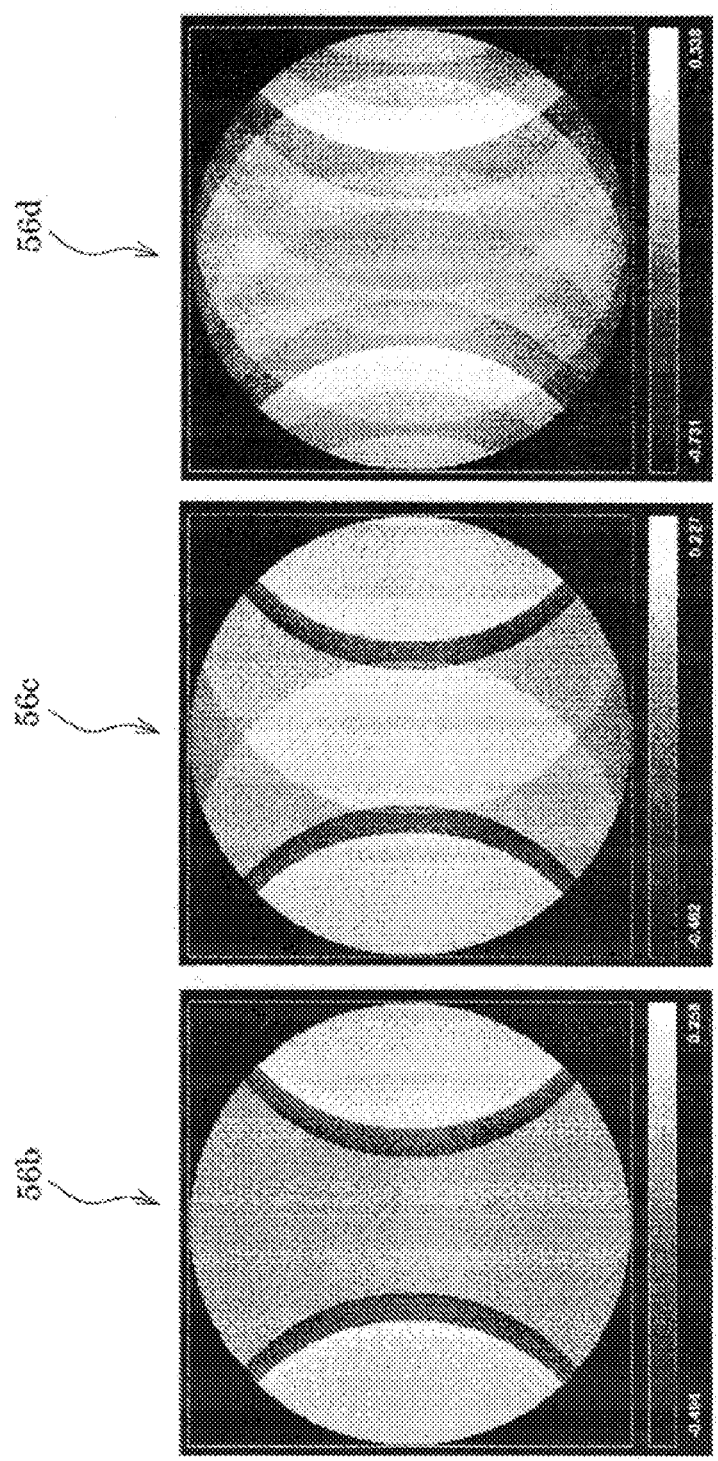

Dist-1

Dist-3

Dist-4

Dist-8

Dist-12

METHOD FOR EVALUATING AND IMPROVING PUPIL LUMINANCE DISTRIBUTION, ILLUMINATION OPTICAL SYSTEM AND ADJUSTMENT METHOD THEREOF, EXPOSURE APPARATUS, EXPOSURE METHOD, AND DEVICE MANUFACTURING METHOD

TECHNICAL FIELD

The present invention relates to a method for evaluating and improving pupil luminance distribution, an illumination optical system and an adjustment method thereof, an exposure apparatus, an exposure method, and a device manufacturing method.

BACKGROUND ART

In exposure apparatuses used for manufacturing devices such as a semiconductor device and the like, a light emitted from a light source forms a secondary light source (a predetermined light intensity distribution on an illumination pupil in general) serving as a substantial surface light source consisting of multiple light sources, via a fly-eye lens serving as an optical integrator. Hereinafter, light intensity distribution on the illumination pupil will be referred to as "pupil luminance distribution". The illumination pupil is defined as a position where by a function of an optical system between an illumination pupil and an irradiation target surface (a mask or a wafer in the case of the exposure apparatus), the irradiation target surface becomes a Fourier transform plane of the illumination pupil.

The light from the secondary light source, after being condensed by a condenser optical system, illuminates in a superimposed manner a mask on which a predetermined pattern is formed. The light having passed through the mask forms an image on the wafer via a projection optical system, and a mask pattern is projected and exposed (transferred) on the wafer. The pattern formed on the mask is fine, and in order to accurately transfer this fine pattern on the wafer a uniform illuminance distribution must be obtained on the wafer.

Conventionally, an illumination optical system is known that realizes a desired pupil luminance distribution using a movable multi-mirror which is configured of multiple minute mirror elements arranged in an array form and whose angle of inclination and inclination direction are driven and controlled individually. In this illumination optical system, because the movable multi-mirror used serves as a spatial light modulator, degrees of freedom is high regarding an outer shape and a distribution change of the pupil luminance distribution, which allows a pupil luminance distribution that is decided appropriately according to characteristics of the pattern that should be transferred having a complex outer shape and distribution to be achieved with good precision.

It is difficult, however, to achieve a desired imaging performance corresponding to a designed pupil luminance distribution, because the pupil luminance distribution which is actually formed on the illumination pupil turn outs to be slightly different from a designed pupil luminance distribution due to various causes, or optical properties other than the pupil luminance distribution turn out to be different from the conditions when the pupil luminance distribution was designed. Therefore, a method of performing optimization on the pupil luminance distribution is proposed (refer to PTL 1), so as to bring an imaging performance according to the actual pupil luminance distribution closer to a desired imaging performance according to the designed pupil luminance distribution.

CITATION LIST

Patent Literature

[PTL 1] International Publication No. WO 2011/102109

SUMMARY OF THE INVENTION

Problems to be Solved by the Invention

In the conventional method for optimization of pupil luminance distribution, because the pupil luminance distribution is represented by a function, optimization of the pupil luminance distribution can be performed by a relatively few parameters and a relatively good prospect. It cannot be said, however, that a spatial light modulator configured by a large number of tiny mirror elements fully shows high degree of freedom that the spatial light modulator originally has concerning an outer shape of the pupil luminance distribution and a change in the distribution.

The present invention was made considering the issues described above, and has as its purpose to provide an improving method in which pupil luminance distribution can be surely and quickly be improved, for example, by a discrete small modulation of the pupil luminance distribution. Further, the present invention has a purpose of providing an illumination optical system that can appropriately adjust the pupil luminance distribution to a target of a desired imaging performance, using the improving method in which pupil luminance distribution is surely and quickly be improved. Further, the present invention also has a purpose of providing an exposure apparatus that can perform good exposure under appropriate illumination conditions, using the illumination optical system that can appropriately adjust the pupil luminance distribution.

Means for Solving the Problems

To solve the problems, in a first form, there is provided an evaluation method to evaluate a pupil luminance distribution formed on an illumination pupil of an illumination optical system that supplies an illumination light to an image-forming optical system which forms an image of a pattern placed on a first plane on a second plane, the method characterized by including:

a first process in which a unit intensity distribution formed on the second plane by light of a unit luminance level supplied from each area of a plurality of unit pupil areas that can be obtained by virtually dividing the illumination pupil is acquired for each unit pupil area;

a second process in which discrete data of the pupil luminance distribution wherein each area of the plurality of unit pupil areas is approximated according to a three-dimensional model having a luminance level expressed by a multiple of the unit luminance level is acquired;

a third process in which light intensity distribution of an aerial image formed on the second plane from the pupil luminance distribution is acquired, based on a plurality of the unit intensity distributions acquired for each unit pupil area in the first process, and the discrete data acquired in the second process; and a fourth process in which an index value of image-forming property obtained from the pupil luminance distribution is acquired, based on the light intensity distribution of the aerial image acquired in the third process.

In a second form, there is provided an improving method to improve a pupil luminance distribution to be formed on an illumination pupil of an illumination optical system that supplies an illumination light to an image-forming optical system which forms an image of a pattern placed on a first plane on a second plane, the method including:

a fifth process in which an index value obtained from a pupil luminance distribution formed on the illumination pupil with a standard pupil luminance distribution serving as a target is acquired, using the evaluation method of the first form;

a sixth process in which a unit change amount of the index value is acquired for each unit pupil area when luminance level of one unit pupil area changes only by a unit luminance level in the discrete data acquired in a preceding process;

a seventh process in which discrete data modulated from the discrete data acquired in the preceding process by an improving technique using the unit change amount of a plurality of the index values acquired for each unit pupil area in the sixth process so as to make an index value obtained from the discrete data modulated approach a target index value is acquired; and an eighth process in which an index value obtained corresponding to the modulated discrete data acquired in the seventh process is acquired, using the evaluation method of the first form, the method characterized in that by repeatedly performing the sixth process to the eighth process until a difference between the index value obtained corresponding to the modulated discrete data and the target index value falls within a permissible range, the pupil luminance distribution to be formed on the illumination pupil is improved.

In a third form, there is provided an adjustment method of an illumination optical system that illuminates an irradiation target surface by light from a light source, the method characterized by including:

improving a pupil luminance distribution to be formed on an illumination pupil of the illumination optical system, using the improving method of the second form, and adjusting the pupil luminance distribution to be formed on the illumination pupil with the improved pupil luminance distribution serving as target.

In a fourth form, there is provided an evaluation method in which a pupil luminance distribution formed on an illumination pupil of an illumination optical system that supplies illumination light to an image-forming optical system which forms an image of a pattern placed on a first plane on a second plane, the method characterized by including:

a first process in which a unit intensity distribution formed on the second plane by light of a unit luminance level supplied from each area of a plurality of unit pupil areas obtained by virtually dividing the illumination pupil, is acquired for each unit pupil area;

a second process in which discrete data of a standard pupil luminance distribution is acquired, according to a three-dimensional model in which each area of the plurality of unit pupil areas has a luminance level expressed by a multiple of the unit luminance level;

a third process in which a light intensity distribution of an aerial image formed on the second plane from the standard pupil luminance distribution is acquired, based on the plurality of the unit intensity distributions acquired for each unit pupil area in the first process and the discrete data of the standard pupil luminance distribution acquired in the second process;

a fourth process in which an index value of image-forming properties obtained from the standard pupil luminance distribution is acquired, based on the light intensity distribution of the aerial image acquired in the third process; and a fifth process in which a unit change amount of the index value obtained when the luminance level of one unit pupil area changes only by a unit luminance level in the discrete data of the standard pupil luminance distribution is acquired for each unit pupil area.

In a fifth form, there is provided an adjustment method of an illumination optical system that illuminates an irradiation target surface by light from a light source, the method characterized by including:

evaluating the pupil luminance distribution formed on the illumination pupil of the illumination optical system, using the evaluation method of the fourth form; and adjusting the pupil luminance distribution formed on the illumination pupil based on results of the evaluation.

In a sixth form, there is provided an illumination optical system characterized in that adjustment is performed by the adjustment method according to one of the third form and the fifth form.

In a seventh form, there is provided an illumination optical system that illuminates an irradiation target surface by light from a light source, the system characterized by comprising:

a pupil distribution measurement device which measures a pupil luminance distribution formed on an illumination pupil of the illumination optical system;

a pupil adjustment device which the adjusts the pupil luminance distribution formed on the illumination pupil, and a controller which controls the pupil adjustment device to adjust the pupil luminance distribution formed on the illumination pupil with the pupil luminance distribution improved using the improving method of the second form.

In an eighth form, there is provided an illumination optical system that illuminates an irradiation target surface by light from a light source, the system characterized by comprising:

a pupil distribution measurement device which measures a pupil luminance distribution formed on an illumination pupil of the illumination optical system;

a pupil adjustment device which adjusts the pupil luminance distribution formed on the illumination pupil, and a controller which controls the pupil adjustment device to adjust the pupil luminance distribution formed on the illumination pupil using the evaluation method of the fourth form.

In a ninth form, there is provided an exposure apparatus, comprising: the illumination optical system according to any one of the sixth form, the seventh form, and the eight form to illuminate a predetermined pattern, the apparatus characterized by exposing the predetermined pattern on a photosensitive substrate.

In a tenth form, there is provided an exposure method in which a predetermined pattern is illuminated by an illumination optical system adjusted by the adjustment method according to any one of the third form and the fifth form, and the predetermined pattern is exposed on a photosensitive substrate via a projection optical system, the method characterized in that at least one of a numerical aperture of the projection optical system, a defocus amount of the photosensitive substrate with respect to the projection optical system, and a wavefront aberration of the projection optical system is adjusted so that an index value of image-forming property nears the target index value.

In an eleventh form, there is provided a device manufacturing method, characterized by comprising:

exposing the predetermined pattern on the photosensitive substrate, using one of the exposure apparatus according to one of the ninth form and the tenth form;

developing the photosensitive substrate on which the predetermined pattern is transferred, and forming a mask layer with a shape corresponding to the predetermined pattern on a surface of the photosensitive substrate, and processing the surface of the photosensitive substrate via the mask layer.

Advantageous Effect of the Invention

In the improving method of the pupil luminance distribution in accordance with the embodiment, for example, by a discrete small modulation of the pupil luminance distribution, the pupil luminance distribution can be quickly and reliably improved so that an imaging performance sufficiently close to the desired imaging performance is obtained. In the illumination optical system related to the embodiment, the pupil luminance distribution can be appropriately adjusted to a desired imaging performance serving as a target, using the improving method for quickly and reliably improving the pupil luminance distribution. In the exposure apparatus of the embodiment, good exposure can be performed under appropriate illumination conditions using the illumination optical system which appropriately adjusts the pupil luminance distribution, which consequently makes manufacturing good devices possible.

BRIEF DESCRIPTION OF DRAWINGS

FIG. 9 is a view schematically showing an internal configuration of the pupil distribution measurement device.

FIGS. 14A to 14C are views showing a distribution of a unit change amount of a pattern line width acquired for each unit pupil area, for three types of mask patterns excluding an anchor pattern.

BEST MODE FOR CARRYING OUT THE INVENTION

Prior to specifically describing an embodiment, a basic idea of an evaluation method and an improving method of pupil luminance distribution related to the present embodiment will be described. In an exposure apparatus, the actual pupil luminance distribution formed on an illumination pupil using a movable multi-mirror turns out to be a distribution slightly different from a basic pupil luminance distribution which is attempted to be formed on the illumination pupil. Further, the imaging performance obtained from the actual pupil luminance distribution turns out to be slightly different from a desired imaging performance corresponding to a designed pupil luminance distribution. Hereinafter, to facilitate the understanding of the description, the basic reference pupil luminance distribution which is attempted to be formed on the illumination pupil is to be the designed pupil luminance distribution.

The designed pupil luminance distribution is appropriately decided according to properties of the pattern which is to be transferred, and in some cases have a complex outer shape and distribution. To be specific, as the designed pupil luminance distribution, a light intensity distribution of a free shape (freeform) having a relatively low pupil filling ratio is sometimes employed. In this case, to achieve an imaging performance sufficiently close to the desired imaging performance corresponding to the designed pupil luminance distribution, it becomes necessary, for example, to acquire the pupil luminance distribution modulated from the designed pupil luminance distribution so that the actual imaging performance sufficiently nears the desired imaging performance by an improving method, and to adjust the pupil luminance distribution with the modulated pupil luminance distribution serving as a target.

Figure 1:
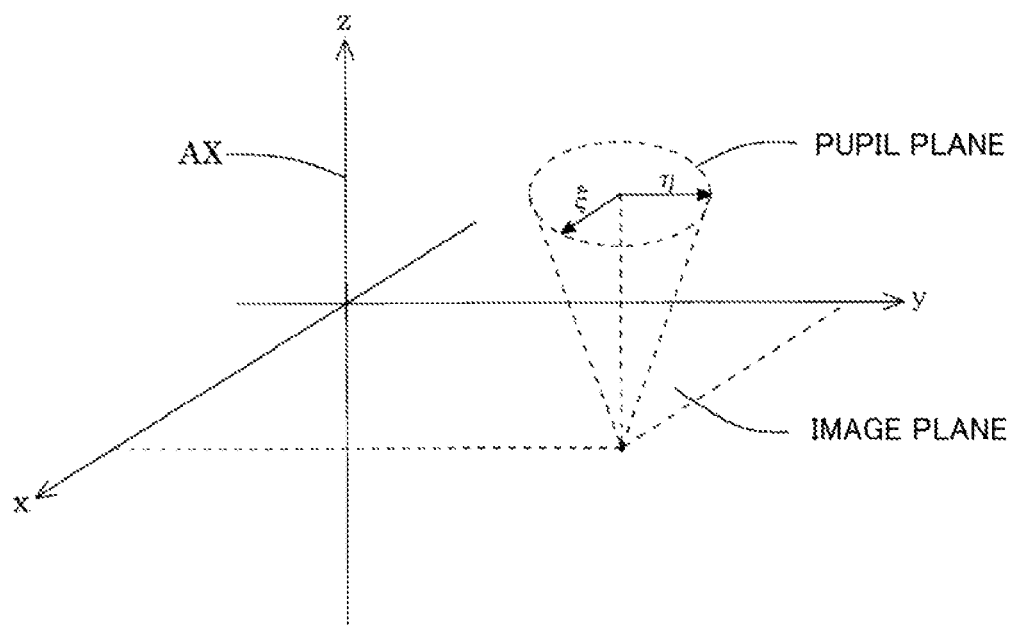
FIG. 1 is a view for describing an image plane coordinate of an image-forming optical system and a pupil plane coordinate of an illumination optical system.

FIG. 1 is a view for describing an image plane coordinate of an image-forming optical system and a pupil plane coordinate of an illumination optical system. FIG. 1 typically shows an image plane orthogonal coordinate (x, y) of an image-forming optical system (corresponding to a projection optical system of the exposure apparatus), and a pupil plane orthogonal coordinate ($\xi$, $\eta$) of an illumination optical system. As an index of image-forming properties obtained corresponding to a pupil luminance distribution, OPE (Optical Proximity Effect: Optical proximity effect) is known. To be specific, an OPE value in the exposure apparatus is, for example, a line width of a resist pattern formed on a photosensitive substrate.

In this case, the OPE value becomes a distribution dependent on a position of the image plane of the projection optical system, that is, a two-dimensional distribution. However, because line width of the resist pattern in two directions orthogonal to each other tends to have a significant meaning in the image plane of the projection optical system, a one-dimensional distribution of the OPE value along an H direction (for example, an X direction in FIG. 1) and a one-dimensional distribution of the OPE value along a V direction (for example, a y direction in FIG. 1) can be treated as information of the OPE value.

A physical quantity that should be noted when improving the pupil luminance distribution is a difference between a desired target OPE value which should be achieved from the designed pupil luminance distribution and an OPE value obtained from the actual pupil luminance distribution formed on the illumination pupil with the designed pupil luminance distribution serving as a target, that is, an OPE error. In the improving method for pupil luminance distribution related to the present embodiment, the pupil luminance distribution that should be formed on the illumination pupil of the illumination optical system which supplies illumination light to the image-forming optical system is improved so that the OPE error which is the index of imaging performance becomes sufficiently small. Hereinafter, to facilitate understanding, details on improvement of the pupil luminance distribution that should be formed on the illumination pupil of the illumination optical system which supplies illumination light to the projection optical system in the exposure apparatus will be described.

Figure 2:
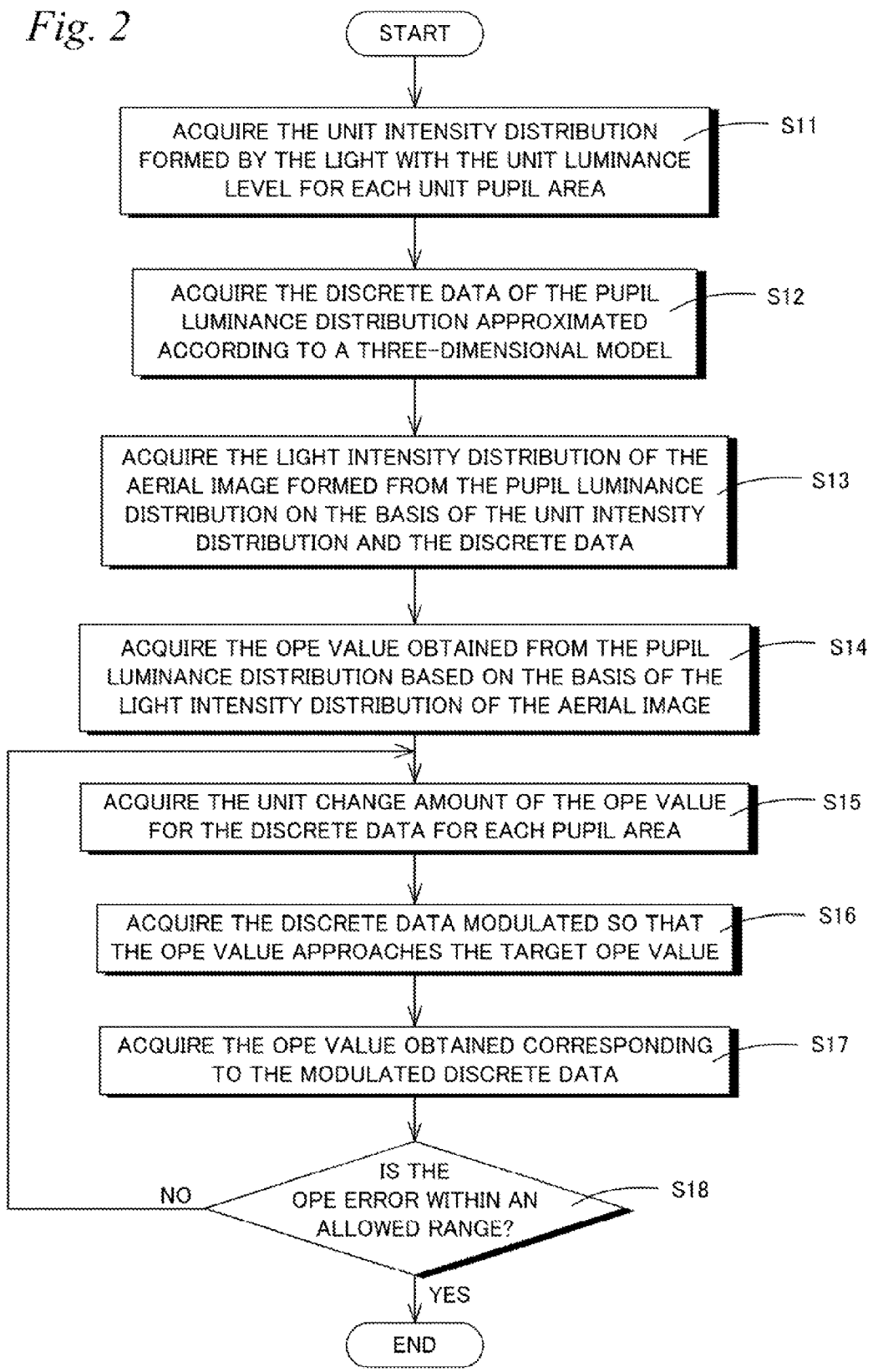
FIG. 2 is a flow chart showing an improving method of a pupil luminance distribution related to an embodiment.

In the improving method of the present embodiment, as shown in a flow chart in FIG. 2, unit intensity distribution formed on the image plane of the projection optical system by a light of a unit luminance level supplied from each area of a plurality of unit pupil areas obtained by virtually dividing the illumination pupil is acquired for each unit pupil area (S11). To be specific, in step S11, as shown in FIG. 3, by virtually dividing the pupil plane along two directions orthogonal to each other in the illumination pupil plane, that is, a $\xi$ direction and a $\eta$ direction, a plurality of rectangular-shaped unit pupil areas 41 is obtained.

Figure 3:
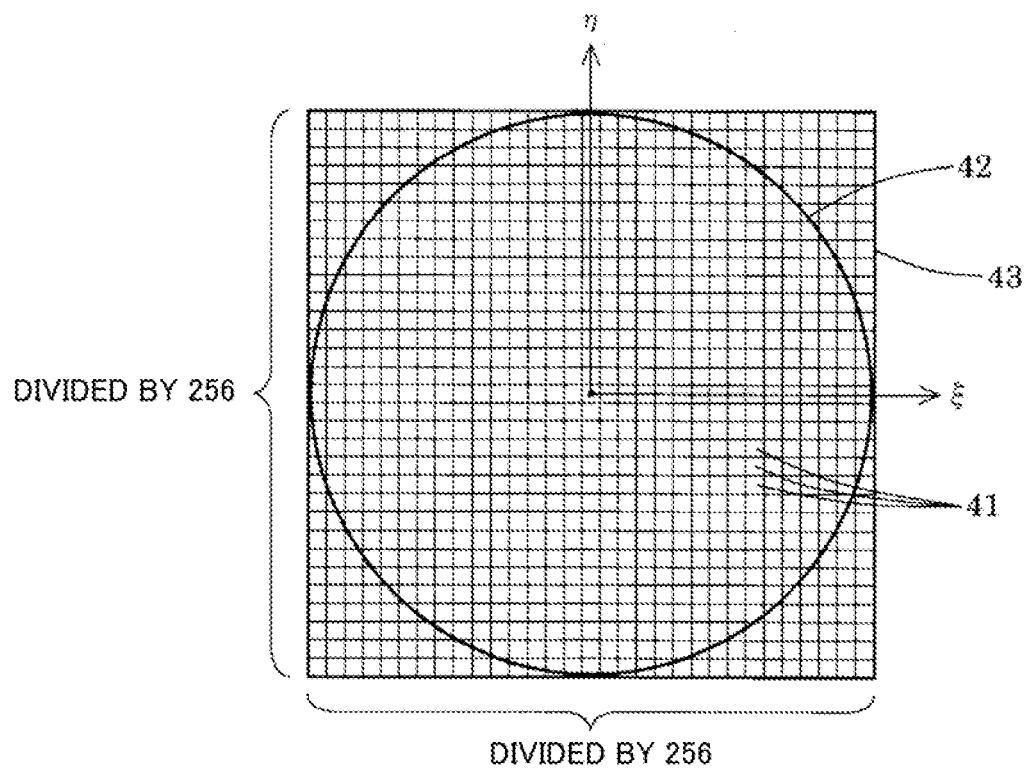
FIG. 3 is a view showing a plurality of rectangular-shaped unit pupil areas obtained by virtually dividing a pupil plane along two directions which are orthogonal.

In FIG. 3, as an example, by equally dividing by 256 in the $\xi$ direction and also equally dividing by 256 in the $\eta$ direction a square shaped pupil area 43 circumscribing a maximum circular area 42 in which the pupil luminance distribution can be formed on the illumination pupil plane of the illumination optical system, 256×256=65,536 square shaped unit pupil areas 41 are obtained. As for virtually dividing the pupil plane, that is, the number of divisions in the $\xi$ direction and the number of divisions in the $\eta$ direction of the pupil plane, and consequently, the shape and size of the unit pupil area and the like can take on various forms.

Figure 4:
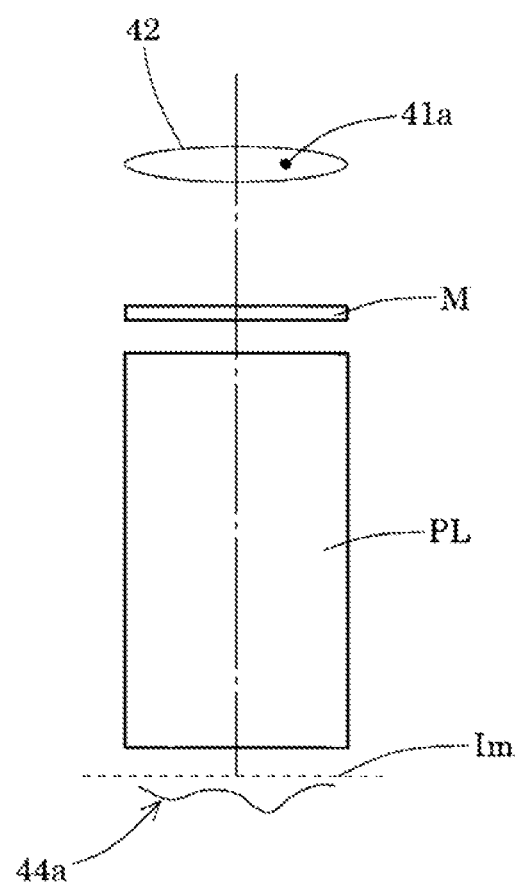
FIG. 4 is a view showing a state where a unit intensity distribution is formed on an image plane of a projection optical system by light from a unit light source.

Further, in step S11, as shown in FIG. 4, for example, when the light of the unit luminance level is at only one unit pupil area 41a in maximum circular area 42 on the pupil plane of the illumination optical system, the light from this unit light source acquires a light intensity distribution (unit intensity distribution) 44a formed on an image plane Im of projection optical system PL, via a mask M and a projection optical system PL. Unit intensity distribution 44a can be obtained accurately from a strict image-forming calculation, based on a three-dimensional structure of a pattern of mask M, optical properties of projection optical system PL and the like.

In general, when applying the improving method of the present embodiment, information such as the three-dimensional structure of the pattern of mask M and optical properties of projection optical system PL is known and is also fixed. Therefore, while the image-forming calculation in which the unit intensity distribution is acquired for each unit pupil is a calculation that requires a relatively long time (a calculation having a relatively large load), it is an operation which can be performed in advance (or a preparatory operation) prior to substantially applying the improving step. That is, although the time required for the image-forming calculation to acquire the unit intensity distribution for each unit pupil area is relatively long, it can be prepared in advance.

In step S11, the unit intensity distribution does not necessarily have to be acquired for each unit pupil area for all of the unit pupil areas in maximum circular area 42. The unit intensity distribution for each unit pupil area only has to be acquired for a required number of unit pupil areas 41 that will most likely be necessary in each of the processes described later on. Now, the time required for image-forming calculation to acquire the unit intensity distribution for each unit pupil area for all of the unit pupil areas in maximum circular area 42 is about the same as the time required for image-forming calculation to acquire a light intensity distribution of an aerial image obtained from a circular shaped pupil luminance distribution corresponding to maximum circular area 42. Accordingly, obtaining the unit intensity distribution for each unit pupil area for the required number of unit pupil areas, and making a database by associating information on the obtained plurality of unit intensity distributions with their corresponding unit pupil areas do not temporally and capacitively force an excessive burden.

When using a numerical expression, in step S11, in the pupil plane coordinate ($\xi$, $\eta$) of the illumination optical system, a unit intensity distribution $I_u$ (x, y, $\xi_n$, $\eta_n$) which is formed of a unit light source having a light of a unit luminance level only at one unit pupil area positioned at a coordinate ($\xi_n$, $\eta_n$) is obtained. That is, for the required numbers of unit pupil areas 41, unit intensity distribution $I_u$ (x, y, $\xi_1$, $\eta_1$), $I_u$ (x, y, $\xi_2$, $\eta_2$), . . . , $I_u$ (x, y, $\xi_N$, $\eta_N$) are each obtained.

Next, in the improving method of the present embodiment, discrete data is acquired (S12) of a pupil luminance distribution approximated according to a three-dimensional model having a luminance level expressed by multiples (including 0 times) of a unit luminance level for each area of a plurality of unit pupils areas. To be specific, as an example of the three-dimensional model, as shown in FIG.

5, a model in which each area of 256×256=65,536 square shaped unit pupil areas has a luminance level each expressed by a unit luminance level of 256 stages can be employed.

Figure 5:
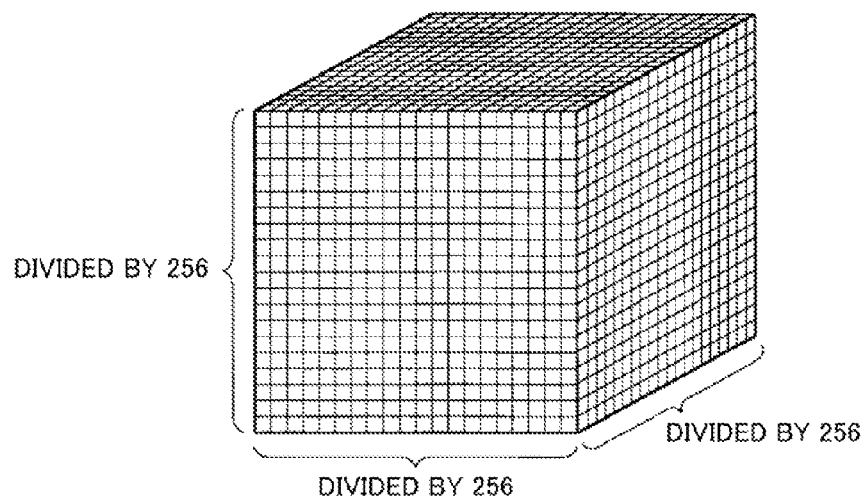
FIG. 5 is a view for describing a three-dimensional model used to acquire discrete data of the pupil luminance distribution.

In step S12, the pupil luminance distribution actually formed on the illumination pupil of the illumination optical system is measured with the designed pupil luminance distribution as a target, and based on the measurement results, the discrete data of the pupil luminance distribution approximated according to the three-dimensional model shown in FIG. 5 is acquired. The discrete data of the pupil luminance distribution formed on the illumination pupil in this manner is expressed as an aggregate of 0 or 1 imparted to a unit cube of 256×256×256=16,777,216 as shown in FIG. 5, and made into a database. In the three-dimensional model shown in FIG. 5, a bottom surface of the aggregate corresponds to the pupil plane, and its height direction corresponds to a direction of the luminance level.

In the unit cube of 256×256=65,536 of the bottom surface section of the aggregate shown in FIG. 5, a unit cube expressed by 0 means that the corresponding unit pupil area does not have luminance, and a unit cube expressed by 1 means that the corresponding unit pupil area has luminance. And, the unit pupil area having luminance means that it has a luminance level obtained by multiplying the number of unit cubes expressed by 1 of the corresponding 256 unit cubes by the unit luminance level. Incidentally, the number of stages of the luminance level in each unit pupil area can be set smaller than the number of divisions in the $\xi$ direction and the number of divisions in the $\eta$ direction of the pupil plane, if necessary.

Next, in the improving method of the present embodiment, based on the plurality of unit intensity distributions obtained for each unit pupil area in step S11 and discrete data obtained in step S12, the light intensity distribution of the aerial image formed on the image plane of the projection optical system by the pupil luminance distribution is acquired (S13). To be specific, in step S13, the light intensity distribution is acquired of the aerial image obtained corresponding to the pupil luminance distribution by a linear combination of the plurality of unit intensity distributions in which the luminance level of each unit pupil area 41 is used as a coefficient.

When using a numerical expression, in step S13, a light intensity distribution $I\{x, y, S(\xi, \eta)\}$ of the aerial image formed on the image plane of the projection optical system by a measured pupil luminance distribution $S(\xi, \eta)$ can be obtained by formula (1) below, based on the plurality of unit intensity distributions $I_u(x, y, \xi_n, \eta_n)$ obtained in step S11 and a luminance level $S(\xi_n, \eta_n)$ of the unit pupil area positioned at the pupil plane coordinate $(\xi_n, \eta_n)$ in the discrete data obtained in step S12.

$$I\{x, y, S(\xi, \eta)\} = \sum_{n=1}^{N} S(\xi_n, \eta_n) I_u(x, y, \xi_n, \eta_n) \quad (1)$$

Next, in the improving method of the present embodiment, based on the light intensity distribution of the aerial image obtained in step S13, an index value of the image-forming properties obtained from the pupil luminance distribution is acquired (S14). To be specific, in step S14, as the index value of the image-forming properties, the OPE value should be acquired which is obtained from the measured pupil luminance distribution. When using a numerical expression, in step S14, the OPE value obtained from the measured pupil luminance distribution is acquired by formula (2), using an evaluation function M.

$$OPE\ value = M[I\{x,y,S(\xi,\eta)\}] \quad (2)$$

As is described above, as long as information such as the three-dimensional structure of the pattern of the mask and the optical properties of the projection optical system is fixed, light intensity distribution $I\{x, y, S(\xi, \eta)\}$ of the aerial image obtained corresponding to the pupil luminance distribution can be calculated by the linear combination of the plurality of unit intensity distributions in which the luminance level of each unit pupil area is used as a coefficient. Meanwhile, calculation of acquiring the intensity distribution of the resist image formed corresponding to light intensity distribution $I\{x, y, S(\xi, \eta)\}$ of the aerial image in the wafer (photosensitive substrate) installed on the image plane of the projection optical system, and calculation of acquiring the line width (that is, the OPE value) of the resist pattern are nonlinear operations expressed with evaluation function M. However, the load is small for this nonlinear operation compared with the image-forming calculation described above.

In steps S11 to S14, the information on the plurality of unit intensity distributions is associated with the required number of unit pupil areas obtained according to the virtually divided model of the pupil plane shown in FIG. 3 and is made into a database, and the information of the pupil luminance distribution formed on the illumination pupil is also made into a database as discrete data according to the three-dimensional model shown in FIG. 5. The virtually divided model of the pupil plane shown in FIG. 3 and the three-dimensional model shown in FIG. 5 are in common regarding the form of virtual division of the pupil plane.

As is described, steps S11 to S14 configure a method of evaluating the pupil luminance distribution formed on the illumination pupil of the illumination optical system which supplies the illumination light to the projection optical system that forms the image of the pattern provided on the mask on the wafer. In the evaluation method consisting of steps S11 to S14, the index value (that is, the OPE value) is acquired obtained from the pupil luminance distribution formed on the illumination pupil of the illumination optical system, with the designed pupil luminance distribution (a standard pupil luminance distribution in general) as a target.

Next, in the improving method of the present embodiment, a unit change amount of the index value when the luminance level of one unit pupil area changes only by a unit luminance level in the discrete data of the pupil luminance distribution acquired in step S12 is acquired, for each unit pupil area (S15). To be specific, in step S15, the unit change amount of the OPE value is acquired for each unit pupil area when the luminance level changes only by the unit luminance level, for a plurality of unit pupil areas that are selected.

Here, concerning all of the unit pupil areas in maximum circular area 42 of the pupil plane of the illumination optical system, a method also can be employed of acquiring the unit change amount of the OPE value when the luminance level changes only by a unit luminance level for each unit pupil area. However, in this method, because an extremely large degree of freedom in modulation is given in which the luminance level of an arbitrary unit pupil area within maximum circular area 42 changes freely to some extent, there is a risk of not only the load of the optimization issue being large but also of the distribution diverging largely from the original pupil luminance distribution. Accordingly, from the viewpoint of avoiding to perform optimization in a solution space too large taking an enormous amount of time, that is, from the viewpoint of optimizing the pupil luminance distribution securely and also quickly, it is desirable to improve the pupil luminance distribution so that the OPE error which is the index for imaging performance is sufficiently small, in a range where the original pupil luminance distribution is not largely modulated.

In the present embodiment, in the discrete data of the pupil luminance distribution acquired in step S12, for a plurality of unit pupil areas having a luminance level equal to or more than the unit luminance level (a first group of unit pupil areas) and a plurality of unit pupil areas adjacent to these plurality of unit pupil areas (a second group of unit pupil areas), the unit change amount of the OPE value when the luminance level changes only by a unit luminance level is acquired for each unit pupil area. At this point, unit pupil areas having an extremely small luminance level (for example, a luminance level with a maximum value of less than 1%) in the discrete data corresponding to the pupil luminance distribution that has been actually measured and do not have luminance in the designed pupil luminance distribution can be excluded from the modulation. Various forms are possible for selection of the unit pupil areas subject to modulation in step S15.

When using a numerical expression, in step S15, by calculating a partial differentiation distribution relating to pupil luminance distribution $S(\xi, \eta)$ of evaluation function M for the plurality of unit pupil areas that have been selected, unit change amount $\partial M/\partial S|_{\xi_n, \eta_n}$ (n=1 to N) of the OPE value when the luminance level changed only by the unit luminance level is acquired for each unit pupil area positioned at coordinate $(\xi_n, \eta_n)$. Information related to the unit change amount of the OPE value, for example, is stored and controlled as a variation table.

As described above, for example, in the case of a pupil luminance distribution with a free form in which the filling rate of the pupil is relatively low, the time required for step S15 is relatively small because the unit change amount of the OPE value does not have to be acquired for a large part of the unit pupil areas that are not subject to modulation. Further, in the case symmetry of the pupil luminance distribution can be used, the amount of calculation required for calculating the partial differentiation distribution of evaluation function M can be suppressed.

Next, in the improving method of the present embodiment, by the improving technique using the unit change amount of the plurality of index values acquired for each unit pupil area in step S15, modulated discrete data is acquired (S16) so that an index value obtained from the modulated discrete data which is modulated from the discrete data acquired in step S12 nears a target index value. In step S16, as an example, discrete data can be acquired which is modulated so that the OPE error is reduced by a steepest descent method that refers to mutual ratio of unit change amount $\partial M/\partial S|_{\xi_n, \eta_n}$ (n=1 to N) of the OPE value for each unit pupil area.

Here, the modulated discrete data is data modulated from the discrete data acquired in step S12 and is expressed according to the three-dimensional model shown in FIG. 5. As is described, in a first improving step S15 and S16, discrete data of the pupil luminance distribution which is modulated so that the OPE error is reduced for certain can be acquired, without having to perform an image-forming calculation that relatively requires a lot of time. As an optimization method (improving technique) in step S16, other appropriate techniques besides the steepest descent method can also be used.

Next, in the improving method of the present embodiment, by using the evaluation method consisting of steps S11 to S14, an index value which is obtained corresponding to the modulated discrete data in step S16 is acquired (S17). The OPE value acquired in step S17 (that is, the OPE value obtained corresponding to the modulated pupil luminance distribution acquired in step S16) becomes a value closer to the target OPE than the OPE value acquired in step S14 (that is, the OPE value obtained corresponding to the measured actual pupil luminance distribution in step S12.

In other words, the OPE error obtained based on the modulated pupil luminance distribution becomes smaller than the OPE error obtained based on the pupil luminance distribution formed on the illumination pupil with the designed pupil luminance distribution which is the original pupil luminance distribution serving as a target. However, because the calculation expressed as evaluation function M is a nonlinear operation, it is difficult to make the OPE error sufficiently small, that is, to make the OPE error fall within a permissible range by performing the improving step once (corresponding to steps S15 and S16 described above).

Therefore, in the improving method of the present embodiment, the pupil luminance distribution that is to be formed on the illumination pupil is improved by repeating steps S15 to S17 until a difference between the index value obtained corresponding to the modulated discrete data in step S17 and the target index value falls within a permissible range. That is, whether the OPE error corresponding to the OPE value acquired in step S17 is within the permissible range or not is judged (S18). In step S18, in the case it is judged that the OPE error acquired in step S17 falls within the permissible range, the improving method of the present embodiment is completed, following an arrow that represents YES in FIG. 2.

Meanwhile in the case it is judged that the OPE error acquired in step S17 is not within the permissible range, the method follows an arrow that represents NO in FIG. 2 and returns to step S15. In step S15 performed a second time, the unit change amount of the OPE value is acquired for each unit pupil area, when the luminance level of one unit pupil area changes only by one unit luminance level in the discrete data of the pupil luminance distribution acquired in step S16. Then in step S16 performed a second time, using an optimization method such as the steepest descent method, discrete data modulated to further reduce the OPE error is acquired.

Next, in step S17 performed a second time, the OPE value obtained corresponding to the modulated discrete data acquired in step S16 performed the second time is acquired. Furthermore, in step S18 performed a second time, whether the OPE error corresponding to the OPE value acquired in step S17 performed the second time is within the permissible range or not is judged. As is described so far, by repeating steps S15 to S17 for a required number of times until the OPE error corresponding to the OPE value acquired in step S17 falls within the permissible range, the pupil luminance distribution to be formed on the illumination pupil is improved, and the modulated pupil luminance distribution obtained in the end serves as the improved pupil luminance distribution.

In the improving method of the pupil luminance distribution related to the present embodiment, the unit change amount of the OPE value is acquired for each unit pupil area, for the plurality of unit pupil areas and the areas adjacent to the plurality of unit pupil areas having a luminance level equal to or more than the unit luminance level in the discrete data. And, by the improving technique using the unit change amounts that were acquired, the discrete data of the pupil luminance distribution is acquired which is modulated so that the OPE value nears the target OPE value. Accordingly, the improving method of the present embodiment is a technique of performing improvement by small modulation in pixels which cannot be expressed in a successive function, and for example, is a technique using high degrees of freedom concerning the change of pupil luminance distribution of the spatial light modulator configured by a large number of small mirror elements.

In the case the outer shape and the distribution is complex as in the free form pupil luminance distribution, and the solution space is consequently complex, by repeating the improving step using the unit change amount of the OPE value acquired for each unit pupil area for only a required number of times, the modulated pupil luminance distribution so that the OPE error falls within the permissible range can be securely acquired, that is, the pupil luminance distribution can be securely improved so that the imaging performance sufficiently close to the desired imaging performance can be obtained. On this operation, when repeatedly performing the improving step, image-forming calculation of a relatively large load does not have to be repeatedly performed for the modulated pupil luminance distribution each time the pupil luminance distribution is modulated, and only a calculation of a relatively small load has to be repeated to acquire the OPE value and the partial differentiation distribution for the modulated pupil luminance distribution. As a consequence, the pupil luminance distribution can be smoothly improved so as to obtain the imaging performance sufficiently close to the desired imaging performance.

Figure 6:
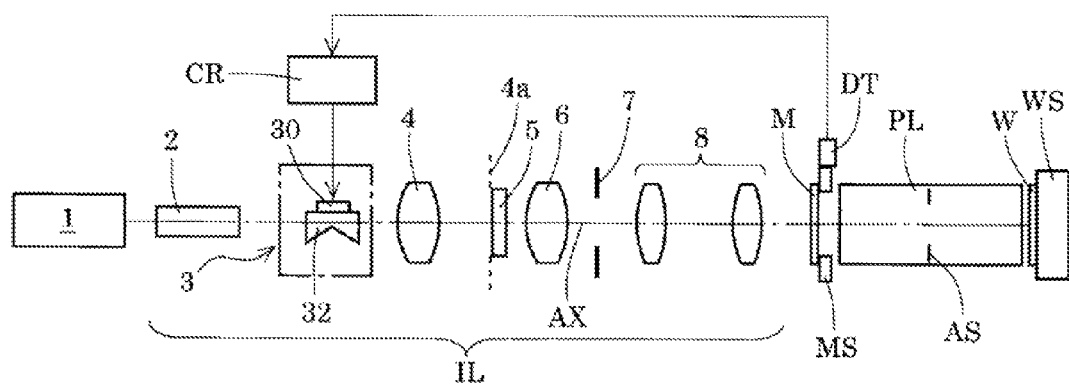
FIG. 6 is a view schematically showing a configuration of an exposure apparatus related to the embodiment.

An embodiment will be described, based on the drawings attached. FIG. 6 is a view that schematically shows a configuration of an exposure apparatus related to the embodiment. In FIG. 6, a Z-axis is set along a normal direction of a transferring surface (exposure surface) of a wafer W which is a photosensitive substrate, an X-axis is set along a direction parallel to a page surface of FIG. 6 within the transferring surface of wafer W, and a Y-axis is set along a direction perpendicular to the page surface of FIG. 6 within the transferring surface of wafer W.

Referring to FIG. 6, in the exposure apparatus of the present embodiment, an exposure light (illumination light) is supplied from light source 1. As light source 1, for example, an ArF excimer laser light source which supplies light having a wavelength of, for example, 193 nm, or a KrF excimer laser light source which supplies light having a wavelength of 248 nm, can be used. The exposure apparatus of the present embodiment is equipped with an illumination optical system IL which includes a spatial light modulation unit 3, a mask stage MS supporting mask M, a projection optical system PL, and a wafer stage WS supporting wafer W, along an optical axis AX of the apparatus.

Light from light source 1 illuminates mask M via illumination optical system IL. The light having passed through mask M forms an image of a pattern of mask M on wafer W, via projection optical system PL. Illumination optical system IL which illuminates a pattern surface (an irradiation target surface) of mask M based on the light from light source 1 performs modified illumination such as multi-pole illumination (such as dipole illumination and quadrupole illumination) and annular illumination, and conventional circular illumination and the like, according to the operation of spatial light modulation unit 3. Further, the light also performs modified illumination based on a free form pupil luminance distribution having a complex outer shape and distribution, according to properties of the pattern of mask M.

Illumination optical system IL is equipped along optical axis AX in order from the light source 1 side; a beam sending section 2, spatial light modulation unit 3, a relay optical system 4, a micro fly-eye lens (or a fly-eye lens) 5, a condenser optical system 6, an illumination field stop (mask blind) 7, and an image-forming optical system 8. Spatial light modulation unit 3, based on the light from light source 1 via beam sending section 2, forms a desired light intensity distribution (pupil luminance distribution) in its far-field area (Fraunhofer diffraction area). Internal configuration and operation of spatial light modulation unit 3 will be described later in the description.

Beam sending section 2 has a function of guiding the incident beam from light source 1 to spatial light modulation unit 3 while converting the beam to a beam having an appropriate size and sectional shape, and also of actively correcting position variation and angular variation of the beam that enters spatial light modulation unit 3. Relay optical system 4 condenses the light from spatial light modulation unit 3 and guides the light to micro fly-eye lens 5. Micro fly-eye lens 5, for example, is an optical element consisting of a large number of small lenses having a positive refractive power which are arranged longitudinally and horizontally and in a packed state, and is configured forming an small lens group by applying an etching processing to a plane-parallel plate.

In the micro fly-eye lens, a large number of small lenses (small refraction surfaces) are integrally formed without being isolated from one another, which is different from the fly-eye lens consisting of lens elements that are isolated from one another. However, on the point that the lens elements are placed longitudinally and horizontally, the micro fly-eye lens is the same wavefront splitting type optical integrator as the fly-eye lens. A rectangular-shaped small refraction surface serving as a unit wavefront splitting surface in micro fly-eye lens 5 is a rectangular shape similar to a shape of the illumination field that should be formed on mask M (consequently the shape of the exposure area that should be formed on wafer W).

Micro fly-eye lens 5 performs wavefront splitting on the incident beam, and forms a secondary light source (a substantial surface light source; pupil luminance distribution) consisting of a large number of small light sources at a rear side focal position or on an illumination pupil in the vicinity of the focal position. An incident surface of micro fly-eye lens 5 is placed at a rear side focal position of relay optical system 4 or in its vicinity. Incidentally, as micro fly-eye lens 5, for example, a cylindrical micro fly-eye lens can also be used. A configuration and operation of the cylindrical micro fly-eye lens is disclosed in, for example, U.S. Pat. No. 6,913,373.

In the present embodiment, Kohler illumination is performed on mask M placed on an irradiation target surface of illumination optical system IL with the secondary light source formed by micro fly-eye lens 5 serving as the light source. Therefore, the position in which the secondary light source is formed is optically conjugate to a position of aperture stop AS of projection optical system PL, and a forming surface of the secondary light source can be referred to as an illumination pupil plane of illumination optical system IL. Typically, the irradiation target surface (the surface on which mask M is placed, or in the case the illumination optical system is to include projection optical system PL, the surface on which wafer W is placed) with respect to the illumination pupil plane becomes an optical Fourier transform plane.

Incidentally, the pupil luminance distribution is a light intensity distribution in the illumination pupil plane of illumination optical system IL or in a surface optically conjugate to the illumination pupil plane. In the case the number of wavefront splitting by micro fly-eye lens 5 is relatively large, a broad light intensity distribution formed on the incident surface of micro fly-eye lens 5 and a broad light intensity distribution (pupil luminance distribution) formed on the entire secondary light source show a high correlation. Therefore, the light intensity distribution in the incident surface of micro fly-eye lens 5 and the surface optically conjugate to the incident surface can also be referred to as pupil luminance distribution.

Condenser optical system 6 condenses the light emitted from micro fly-eye lens 5, and illuminates illumination field stop 7 in an overlapping manner. The light that has passed through illumination field stop 7 forms an illumination area which is an image of an opening section of illumination field stop 7 in at least a part of a pattern forming area of mask M, via image-forming optical system 8. Incidentally, in FIG. 6, while installation of an optical path bending mirror for bending the optical axis (or consequently, the optical path) is omitted, it is possible to appropriately place an optical path bending mirror on illumination optical path as necessary.

On mask stage MS, mask M is mounted along an XY plane (for example, a horizontal plane), and on wafer stage WS, wafer W is mounted along the XY plane. Projection optical system PL forms an image of the pattern of mask M on a transferring surface (exposure surface) on wafer W, based on light from the illumination area formed on the pattern surface of mask M by illumination optical system IL. By performing batch exposure or scanning exposure while controlling the drive of wafer stage WS two-dimensionally within a plane (XY plane) orthogonal to optical axis AX of projection optical system PL and consequently controlling the drive of wafer W two-dimensionally in the manner described above, the pattern of mask M is sequentially exposed in each exposure area of wafer W.

Figure 7:
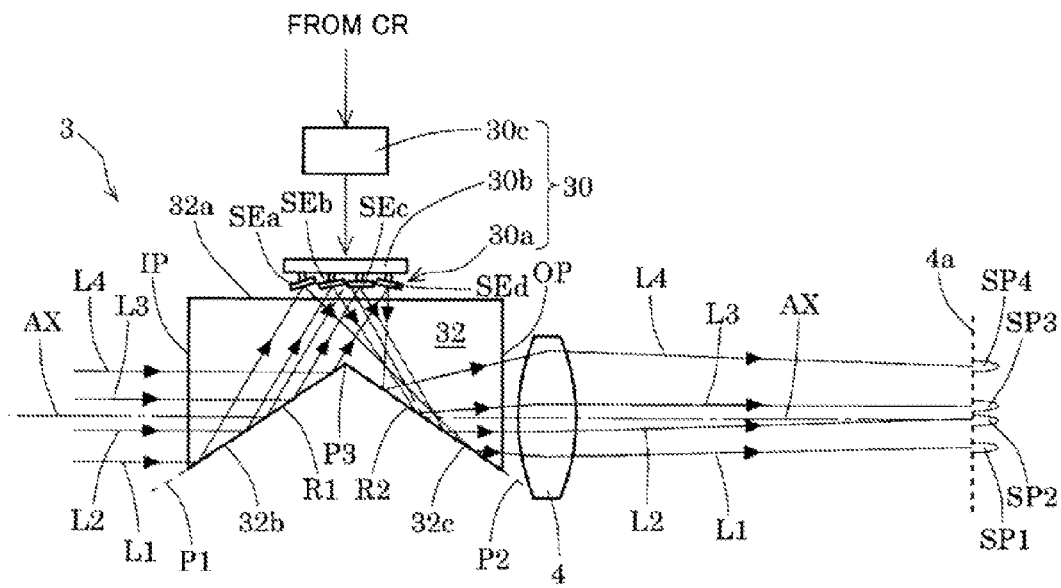
FIG. 7 is a view schematically showing a configuration and an operation of a spatial light modulation unit.
Figure 8:
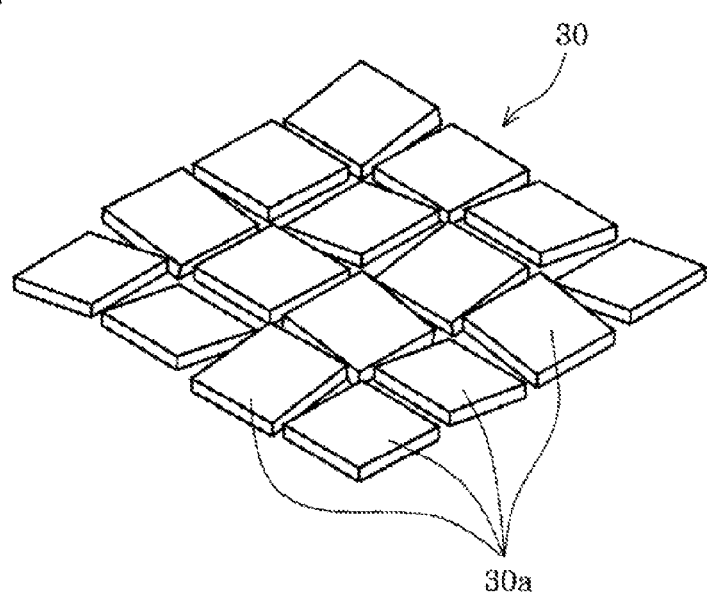
FIG. 8 is a partially perspective view of a spatial light modulator in the spatial light modulation unit.

Internal configuration and operation of spatial light modulation unit 3 will be described, referring to FIGS. 7 and 8. Spatial light modulation unit 3, as shown in FIG. 7, is equipped with a prism 32, and a spatial light modulator 30 which is placed close to a side surface 32a being parallel to a YZ plane of prism 32. Prism 32, for example, is formed of an optical material such as fluorite or quartz.

Spatial light modulator 30 is equipped, for example, with the plurality of mirror elements 30a which is arranged two-dimensionally along the YZ plane, a board 30b for holding the plurality of mirror elements 30a, and a driving section 30c which individually controls and drives an attitude of the plurality of mirror elements 30a via a cable (not shown) connected to board 30b. In spatial light modulator 30, by the operation of driving section 30c which operates based on control signals from a control section CR, the attitude of the plurality of mirror elements 30a changes, respectively, and each mirror element 30a is set, respectively, to a predetermined direction.

Prism 32 has a shape which can be obtained by replacing a side surface of a rectangular parallelepiped shape (a side surface that faces side surface 32a where the plurality of mirror elements 30a of spatial light modulator 30 are placed in proximity) with side surfaces 32b and 32c that are recessed in a V-shape, and is also called a K prism after the sectional surface shape along the XZ plane. Side surfaces 32b and 32c of prism 32 recessed in the V-shape are defined according to planes P1 and P2 which intersect so as to form an obtuse angle. The two planes P1 and P2 are both orthogonal to the XZ plane, and are shaped in a letter V along the XZ plane.

Inner surfaces of the two side surfaces 32b and 32c that are in contact with a tangent (straight line extending in a Y direction) P3 of the two planes P1 and P2 function as reflection surfaces R1 and R2. That is, reflection surface R1 is positioned on plane P1 and reflection surface R2 is positioned on plane P2, with the angle that reflection surfaces R1 and R2 make being an obtuse angle. As an example, the angle formed by reflection surfaces R1 and R2 can be 120 degrees, the angle formed by an incident surface IP of prism 32 perpendicular to optical axis AX and reflection surface R1 can be 60 degrees, and the angle formed by an outgoing surface OP of prism 32 perpendicular to optical axis AX and reflection surface R2 can be 60 degrees.

In prism 32, side surface 32a to which the plurality of mirror elements 30a of spatial light modulator 30 is placed in proximity and optical axis AX are parallel, and also reflection surface R1 is positioned at the light source 1 side (upstream side of the exposure apparatus: left hand side in FIG. 7) and reflection surface R2 is positioned at the micro fly-eye lens 5 side (downstream side of the exposure apparatus: right hand side in FIG. 7). More particularly, reflection surface R1 is provided slantwise with respect to optical axis AX, and reflection surface R2 is provided slantwise with respect to optical axis AX symmetrically to reflection surface R1 in a surface that passes through tangent P3 and is also parallel to the XY plane.

Reflection surface R1 of prism 32 reflects light that has entered via incident surface IP toward spatial light modulator 30. The plurality of mirror elements 30a of spatial light modulator 30 is placed on an optical path between reflection surface R1 and reflection surface R2, and reflects the entering light having passed through reflection surface R1. Reflection surface R2 of prism 32 reflects light that has entered after passing through spatial light modulator 30, and guides the light to relay optical system 4 via outgoing surface OP.

Spatial light modulator 30 emits the entering light having passed through reflection surface R1, after having applied spatial modulation according to its entering position. Spatial light modulator 30, as shown in FIG. 8, is equipped with the plurality of small mirror elements (optical elements) 30a which are arranged two-dimensionally within a predetermined plane. While an example of a configuration is shown of spatial light modulator 30 equipped with 4×4=16 mirror elements 30a in FIGS. 7 and 8 to simplify the description and drawings, the number of mirror elements 30a equipped is actually much larger than 16.

Referring to FIG. 7, of a group of lights entering spatial light modulation unit 3 along a direction parallel to optical axis AX, a light L1 enters a mirror element SEa of the plurality of mirror elements 30a, and a light L2 enters a mirror element SEb different from mirror element SEa. Similarly, a light L3 enters a mirror element SEc different from mirror elements SEa and SEb, and a light L4 enters a mirror element SEd different from mirror elements SEa to SEc. Mirror elements SEa to SEd provide spatial modulation set according to their positions to lights L1 to L4.

An arrangement surface of the plurality of mirror elements 30a of spatial light modulator 30 is placed at a front side focal position of relay optical system 4, or in its vicinity. The lights reflected by the plurality of mirror elements 30a of spatial light modulator 30 and are given a predetermined angle distribution form predetermined light intensity distributions SP1 to SP4 on a rear side focal plane 4a of relay optical system 4. That is, relay optical system 4 converts the angle that the plurality of mirror elements 30a of spatial light modulator 30 gives to the outgoing light to a position on plane 4a which is a far-field area (Fraunhofer diffraction area) of spatial light modulator 30.

Referring back to FIG. 7, an incident surface of micro fly-eye lens 5 is positioned at a position on the rear side focal plane 4a relay optical system 4. Accordingly, the pupil luminance distribution formed on an illumination pupil immediately after micro fly-eye lens 5 corresponds to the distribution of light intensity distributions SP1 to SP4 that spatial light modulator 30 and relay optical system 4 form on the incident surface of micro fly-eye lens 5. Spatial light modulator 30, as shown in FIG. 8, for example, is a movable multi-mirror including a large number of small mirror elements 30a arranged regularly and two-dimensionally on one plane in a state where a planar reflection surface serves as the upper surface.

Each mirror element 30a is movable, and a tilt of its reflection surface (that is, tilt angle and tilt direction of the reflection surface) is independently controlled by an operation of driving section 30c which operates according to a command from control section CR. Each mirror element 30a can rotate by only a desired rotation angle successively or discretely with two directions (Y direction and a Z direction) that are parallel to the arrangement surface and are also orthogonal to each other serving as rotary shafts. That is, the tilt of the reflection surface of each mirror element 30a can be controlled two-dimensionally.

In the case of discretely rotating the reflection surface of each mirror element 30a, it is preferable to perform switching control of the rotation angle in a plurality of states (for example, . . . , −2.5 degrees, −2.0 degrees, . . . 0 degrees, +0.5 degrees . . . +2.5 degrees, . . . ). While FIG. 8 shows mirror element 30a having a square outer shape, the outer shape of mirror element 30a is not limited to a square. However, from the viewpoint of light-use efficiency, a shape that can be arranged so that mirror element 30a has only a small gap (a shape that can be most densely filled) is preferable. Further, from the viewpoint of light-use efficiency, the gap between two mirror elements 30a adjacent to each other is preferably suppressed to the minimum.

In spatial light modulator 30, by the operation of driving section 30c which operates according to control signals from control section CR, attitude of the plurality of mirror elements 30a each change so that each mirror element 30a is set to a predetermined orientation. The lights reflected by each of the plurality of mirror elements 30a of spatial light modulator 30 at predetermined angles form a multi-pole (such as dipole or quadrupole), an annular, a circular or the like light intensity distribution (pupil luminance distribution) on the illumination pupil immediately after micro fly-eye lens 5, via relay optical system 4. Further, on the illumination pupil immediately after micro fly-eye lens 5, the pupil luminance distribution is formed having a complex outer shape and distribution according to the properties of the pattern of mask M.

That is, relay optical system 4 and micro fly-eye lens 5, based on the lights via spatial light modulator 30 of spatial light modulation unit 3, configure a distribution forming optical system which forms a predetermined light intensity distribution on an illumination pupil of illumination optical system IL. A pupil luminance distribution corresponding to the light intensity distribution in the illumination pupil immediately after micro fly-eye lens 5 is formed, also at the rear side focal position of micro fly-eye lens 5 or another illumination pupil position which is optically conjugate to an illumination pupil in its vicinity, that is, at a pupil position of image-forming optical system 8 and a pupil position (a position of aperture stop AS) of projection optical system PL.

The exposure apparatus of the present embodiment, for example, is equipped with a pupil distribution measurement device DT attached to mask stage MS that measures the pupil luminance distribution formed on the illumination pupil of illumination optical system IL. Pupil distribution measurement device DT, as shown in FIG. 9, has a pinhole member 10, a condensing lens 11, and a photodetector 12 such as, for example, a two-dimensional CCD imaging sensor. Pinhole member 10 is placed at the irradiation target surface of illumination optical system IL (that is, at a height position where a pattern surface Pm of mask M should be positioned on exposure) on measurement. Further, pinhole member 10 is placed at a front side focal position of condensing lens 11, and a detection surface of photodetector 12 is placed at a rear side focal position of condensing lens 11.

Accordingly, the detection surface of photodetector 12 is placed at a position optically conjugate to the illumination pupil of illumination optical system IL, that is, at a position optically conjugate to a pupil plane of image-forming optical system 8. In pupil distribution measurement device DT, the light via illumination optical system IL passes a pinhole of pinhole member 10, and after going through a condensing operation of condensing lens 11, reaches the detection surface of photodetector 12. On the detection surface of photodetector 12, a light intensity distribution is formed which corresponds to a light intensity distribution (pupil luminance distribution) in the pupil plane of image-forming optical system 8.

As is described, pupil distribution measurement device DT measures the light intensity distribution in the surface optically conjugate to the illumination pupil of illumination optical system IL (the pupil plane of image-forming optical system 8), based on the light which has passed through the irradiation target surface of illumination optical system IL. Specifically, pupil distribution measurement device DT monitors pupil luminance distribution (pupil luminance distribution that the light entering each point forms on an outgoing pupil position of illumination optical system) related to each point on the irradiation target surface by the illumination optical system.

Control section CR, which has an overall control of the operation of the exposure apparatus, controls the plurality of mirror elements 30a of spatial light modulator 30 so that a desired pupil luminance distribution is formed on the illumination pupil, while referring to measurement results by pupil distribution measurement device DT. Further details on the configuration and operation concerning of pupil distribution measurement device DT can be referred to in, for example, Japanese Unexamined Patent Application Publication No. 2000-19012. Further, as pupil distribution measurement device DT, a device which detects pupil luminance distribution via a pinhole disclosed in, for example, U.S. Pat. No. 5,925,887 can also be used.

Further, instead of pupil distribution measurement device DT, or in addition to pupil distribution measurement device DT, a pupil distribution measurement device DTw (not shown) can also be provided that measures the pupil luminance distribution in a pupil plane of projection optical system PL (an outgoing pupil plane of projection optical system PL), based on the light via projection optical system PL (that is, based on the light having passed through an image plane of projection optical system PL). Specifically, pupil distribution measurement device DTw, for example, is equipped with an imaging section that has a photoelectric conversion surface placed at a position optically conjugate to a pupil position of projection optical system PL, and monitors pupil luminance distribution (pupil luminance distribution that the light entering each point forms on the pupil position of projection optical system PL) related to each point of the image plane of projection optical system PL. Details on the configuration and operation of these pupil distribution measurement devices can be referred to in, for example, U.S. Patent Application Publication No. 2008/0030707. Further, as the pupil distribution measurement device, the disclosure of U.S. Patent Application Publication No. 2010/0020302 can also be referred.

In the exposure apparatus, to transfer the pattern of mask M onto wafer W with high precision in a faithful manner, it is important, for example, to perform exposure under appropriate illumination conditions corresponding to pattern properties of mask M. In the present embodiment, the pupil luminance distribution formed by the operation of spatial light modulator 30 can be freely and quickly changed, using spatial light modulation unit 3 equipped with spatial light modulators 30 in which the attitude of the plurality of mirror elements 30a each change individually, and as a consequence, various illumination conditions can be realized. That is, in illumination optical system IL, because spatial light modulator 30 having a large number of mirror elements 30a whose attitude is individually controlled is used, the degree of freedom regarding change in the outer shape and distribution of the pupil luminance distribution formed in illumination pupil is high.

However, as is previously described, because the pupil luminance distribution formed on the illumination pupil using spatial light modulation unit 3 slightly differs from the designed pupil luminance distribution, it is difficult to achieve a desired imaging performance that corresponds to designed pupil luminance distribution. In the exposure apparatus of the present embodiment, the improving method of pupil luminance distribution related to the present embodiment is used to improve pupil luminance distribution that should be formed on the illumination pupil of illumination optical system IL, pupil luminance distribution formed on the illumination pupil is adjusted with the improved pupil luminance distribution serving as a target, and illumination optical system IL is consequently adjusted, so that an imaging performance sufficiently close to the desired imaging performance can be obtained.

Figure 10:
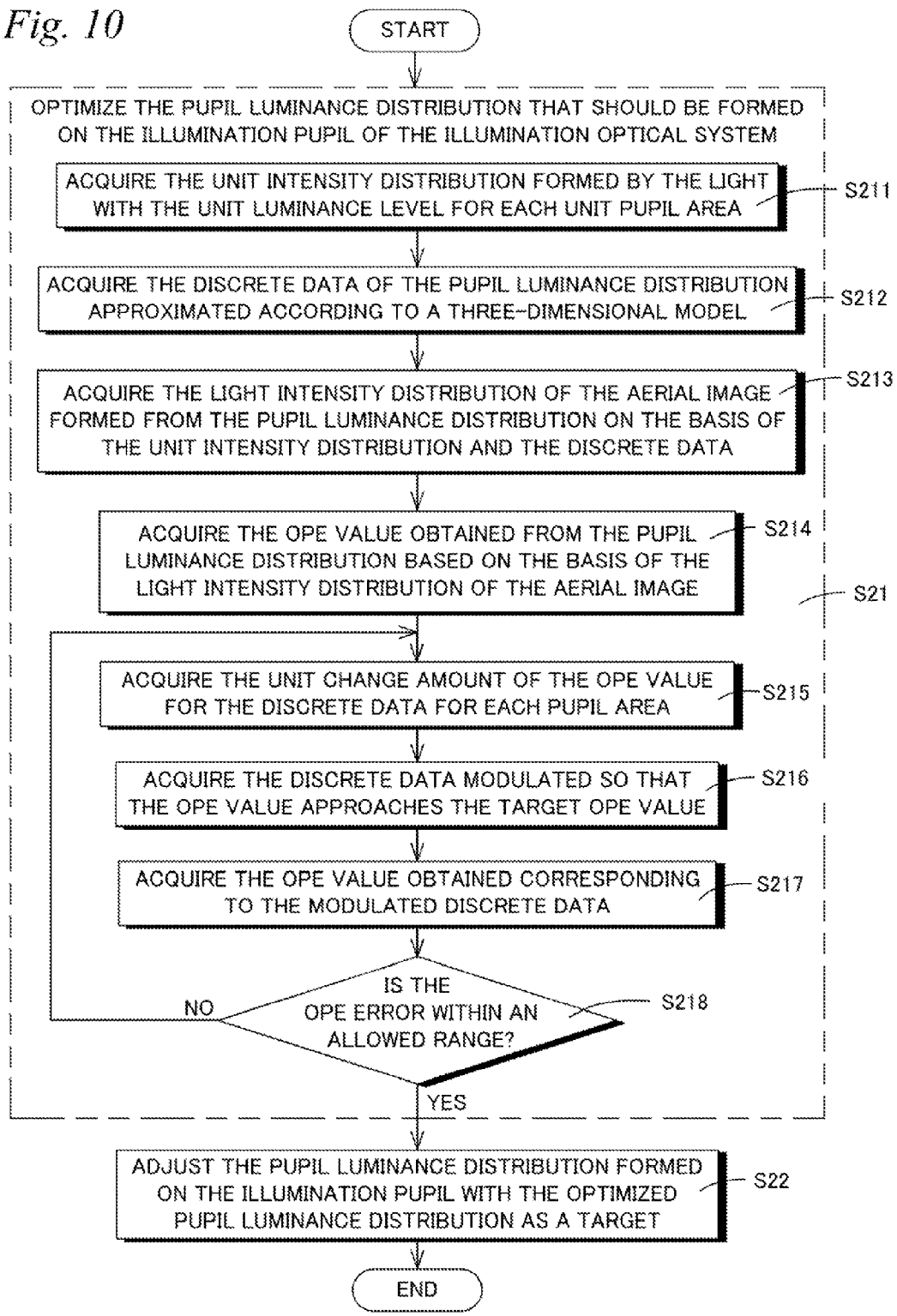
FIG. 10 is a flow chart of an adjustment method of the illumination optical system related to the embodiment.

FIG. 10 is a flow chart of an adjustment method of the illumination optical system related to the present embodiment. In the adjustment method of illumination optical system IL related to the present embodiment, the pupil luminance distribution that should be formed on the illumination pupil of the illumination optical system is improved, using the improving method of pupil luminance distribution described referring to FIG. 2 (S21). That is, step S21 has steps S211 to S218 that correspond to steps S11 to S18 in FIG. 2.

Specifically, in step S21, when forming a pupil luminance distribution in the illumination pupil with the designed pupil luminance distribution serving as a target, the light intensity distribution in a surface optically conjugate to the illumination pupil of illumination optical system IL is measured at all times, using pupil distribution measurement device DT attached to mask stage MS. Measurement results of pupil distribution measurement device DT are supplied to control section CR. Control section CR, by controlling the attitude of each of the plurality of mirror elements 30a of spatial light modulator 30 referring to the measurement results of pupil distribution measurement device DT, forms a pupil luminance distribution in the illumination pupil close as much as possible to the designed pupil luminance distribution.

Next, in step S21, a modulated pupil luminance distribution in which the OPE error falls within a permissible range is acquired with the actual pupil luminance distribution slightly different from the designed pupil luminance distribution as the original pupil luminance distribution, and consequently, the pupil luminance distribution is improved so that an imaging performance sufficiently close to the desired imaging performance can be obtained. In the exposure apparatus of the present embodiment, for example, control section CR serving as an information processing device can be made to execute the improving method of the pupil luminance distribution which includes steps S211 to S218, according to a predetermined program.

Next, in the adjustment method of illumination optical system IL related to the present embodiment, the pupil luminance distribution formed on the illumination pupil is adjusted, with the improved pupil luminance distribution serving as a target (S22). That is, in step S22, by controlling the attitude of each of the plurality of mirror elements 30a of spatial light modulator 30 while referring to the measurement results of pupil distribution measurement device DT, a pupil luminance distribution as close as possible to the pupil luminance distribution improved in step S21 is formed on the illumination pupil, and consequently the pupil luminance distribution formed on the illumination pupil of illumination optical system IL is adjusted. In the description below, a concrete procedure of adjusting the pupil luminance distribution formed on the illumination pupil with the improved pupil luminance distribution serving as a target will be described.

In step S22, control section CR measures the pupil luminance distribution formed on the illumination pupil with the improved pupil luminance distribution serving as a target, for example, using pupil distribution measurement device DT. That is, the pupil luminance distribution actually formed on the illumination pupil is measured as a light intensity distribution in a surface optically conjugate to the illumination pupil, based on the light that has passed through the pattern surface (or as it will be described later on, light proceeding toward the pattern surface) of mask M serving as the irradiation target surface. Control section CR converts the information of the light intensity distribution (that is, the pupil luminance distribution) measured by pupil distribution measurement device DT into discrete data according to a three-dimensional model shown in FIG. 5.

The discrete data of the pupil luminance distribution improved in step S21 and the pupil luminance distribution formed on the illumination pupil with the improved pupil luminance distribution serving as a target, that is, the discrete data of the light intensity distribution measured by pupil distribution measurement device DT in step S22, are both data made according to the same three-dimensional model (that is, data that are both made according to the same rule). As a consequence, control section CR, by comparing the two discrete data, is able to grasp a divergence of the pupil luminance distribution formed on the illumination pupil with respect to the improved pupil luminance distribution for each unit pupil area, and consequently by controlling spatial light modulator 30 to which the divergence information for each unit pupil area is reflected, a pupil luminance distribution sufficiently close to the improved pupil luminance distribution can be formed on the illumination pupil. In the description below, a technique of judging that the divergence of the discrete data of the measured light intensity distribution with respect to the discrete data of the improved pupil luminance distribution is sufficiently small will be described, when control section CR controls spatial light modulator 30.

In a first technique, using the discrete data of the measured light intensity distribution and the database of the plurality of unit intensity distributions that are obtained associated with each unit pupil area in the improving method previously described, light intensity distribution of the aerial image obtained on the image plane of the projection optical system corresponding to the measured light intensity distribution is acquired without performing image-forming calculation, and consequently the OPE value corresponding to the measured light intensity distribution is acquired. Then, while referring to an OPE error of the OPE value acquired with respect to a target OPE value, by controlling spatial light modulator 30 until the OPE error falls within a permissible range, a pupil luminance distribution sufficiently close to the improved pupil luminance distribution is formed on the illumination pupil. As is described, in the first technique, the light intensity distribution of the aerial image obtained on the image plane of the projection optical system corresponding to the discrete data of the measurement results of the light intensity distribution is acquired, based on the discrete data of the measurement results the light intensity distribution and the unit intensity distribution for each unit pupil area, and based on the acquired light intensity distribution of the aerial image, an index value difference (OPE error) corresponding to a difference between the discrete data of the improved pupil luminance distribution and the discrete data of the measurement results of the light intensity distribution is acquired.

In a second technique, in the discrete data of the improved pupil luminance distribution, a unit change amount $\partial M/\partial S|\xi, \eta$ of the OPE value when the luminance level of one unit pupil area changes by a unit luminance level is acquired for each unit pupil area. Then, using the unit change amount $\partial M/\partial S|\xi, \eta$ of the OPE value acquired for each unit pupil area, an index value difference (OPE error) $\epsilon$ corresponding to a difference between discrete data $S_T(\xi, \eta)$ of the improved pupil luminance distribution and discrete data $S(\xi, \eta)$ of the measurement results of the light intensity distribution is acquired from formula (3) below.

$$\varepsilon \equiv \int \left[ \{S(\xi, \eta) - S_T(\xi, \eta)\} \times \frac{\partial M}{\partial S} \bigg|_{\xi, \eta} \right] d\xi d\eta \quad (3)$$

In the second technique, because the index value difference (OPE error) $\epsilon$ concerning the OPE value acquired by formula (3) has a positive/negative reference sign, by controlling spatial light modulator 30 while referring to the value of such index value difference $\epsilon$ and the reference sign, the pupil luminance distribution sufficiently close to the improved pupil luminance distribution can be formed quickly on the illumination pupil. The second technique utilizes the point that calculation of the OPE value of the pupil luminance distribution can be performed easily and quickly by a primary approximation accuracy, when using the point that the pupil luminance distribution formed on the illumination pupil by spatial light modulator 30 with the improved pupil luminance distribution serving as a target is extremely close to the improved pupil luminance distribution, and the unit change amount of the OPE value in the vicinity of the improved pupil luminance distribution. As is described, in the second technique, the unit change amount of the index value when the luminance level of one unit pupil area changes only by a unit luminance level is acquired for each unit pupil area in the discrete data of the improved pupil luminance distribution, and by using the unit change amount of the plurality of index values acquired for each unit pupil area, the index value difference (OPE error) corresponding to the difference between the discrete data of the improved pupil luminance distribution and the discrete data of the measurement results of the light intensity distribution is acquired.

As is described so far, in the adjustment method of illumination optical system IL related to the present embodiment, because the improved pupil luminance distribution and the control of the spatial light modulator (that is, adjustment of the pupil luminance distribution) both use discrete data which is converted into the same three-dimensional model, the pupil luminance distribution formed on the illumination pupil with the improved pupil luminance distribution serving as a target can be securely and quickly adjusted. That is, the pupil luminance distribution can be appropriately adjusted with a desired imaging performance serving as a target, using the improving method for securely and quickly improving the pupil luminance distribution. As a consequence, with the exposure apparatus (IL, MS, PL, WS) of the present embodiment, devices having good performance can be manufactured, by performing good exposure under appropriate illumination conditions using illumination optical system IL which appropriately adjusts the pupil luminance distribution with a desired imaging performance as a target.

Incidentally, in the description above, while the description is made on the premise that the optical properties of the projection optical system are fixed, by adjusting the numerical aperture of the projection optical system, defocus amount of the photosensitive substrate with respect to the projection optical system, wavefront aberration (a component corresponding to spherical aberration) of the projection optical system and the like, the OPE value which is the index value of the image-forming properties in the exposure apparatus can be made to further approach the target OPE. However, in this case, image-forming calculation should be performed again under new conditions in which optical properties of the projection optical system are changed, and necessary adjustment amounts regarding the projection optical system should be acquired, using a nonlinear least-squares method and the like.

Figure 11:
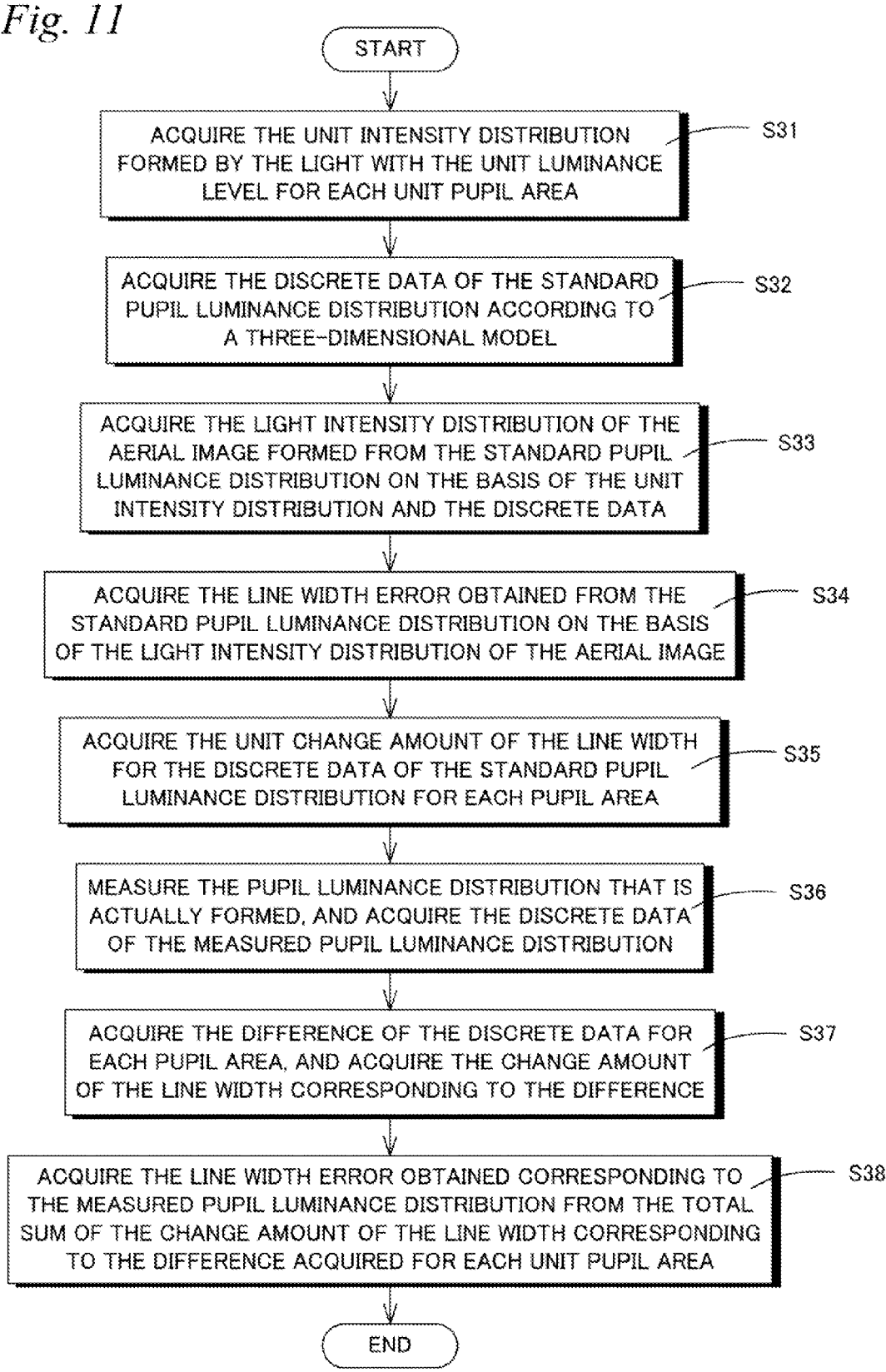
FIG. 11 is a flow chart showing an evaluation method of a pupil luminance distribution related to a second embodiment.
Figure 12:
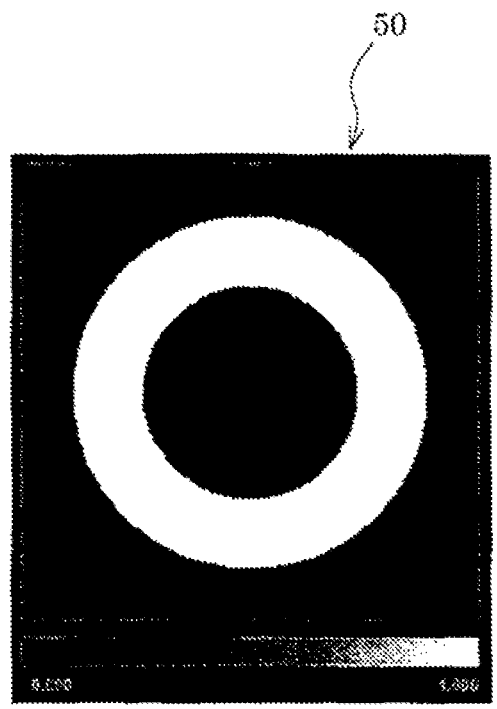
FIG. 12 is a view showing a designed pupil luminance distribution assumed as a pupil luminance distribution to be evaluated in the evaluation method of the second embodiment.

FIG. 11 is a flow chart showing an evaluation method of pupil luminance distribution related to a second embodiment. In the evaluation method of the second embodiment, as the pupil luminance distribution to be evaluated, an annular form having a designed pupil luminance distribution 50 as shown in FIG. 12 is assumed. Further, in the evaluation method of the second embodiment, as a pattern image (resist pattern) to be formed on wafer W via projection optical system (image-forming optical system) PL, four types of patterns images 51, 52, 53, and 54 are assumed as shown in FIGS. 13A, 13B, 13C, and 13D.

Figure 13A:
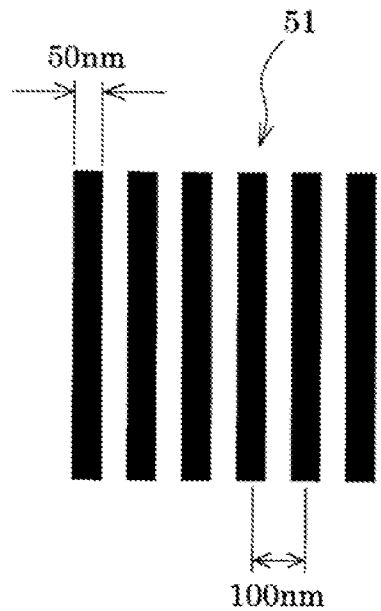
FIGS. 13A to 13D are views showing four types of pattern images which are assumed as pattern images to be formed in the evaluation method of the second embodiment.
Figure 13B:
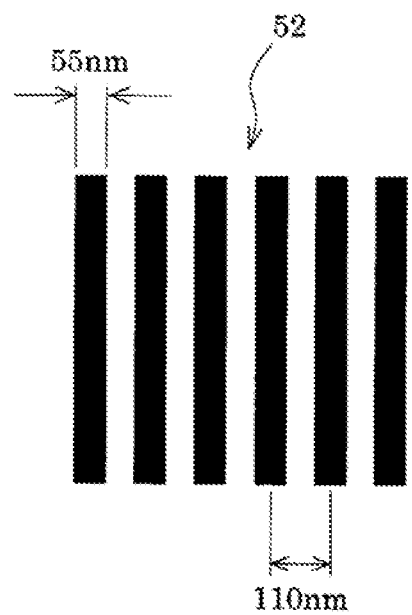

Specifically, the annular ratio (inner diameter/outer diameter) of pupil luminance distribution 50 is around 2/3. Pattern image 51 shown in FIG. 13A is a line-and-space pattern that has a line section blackened in the drawing having a line width of 50 nm and a pitch of 100 nm, and pattern image 52 shown in FIG. 13B is a line-and-space pattern that has a line section having a line width of 55 nm and a pitch of 110 nm. Pattern image 53 shown in FIG. 13C is substantially an isolated pattern that has a line section having a line width of 60 nm and a pitch of 220 nm, and pattern image 54 shown in FIG. 13D is substantially an isolated pattern that has a line section having a line width of 60 nm and a pitch of 700 nm.

Figure 13C:
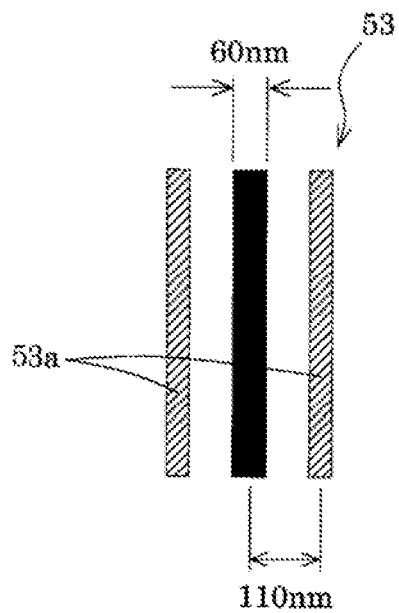
Figure 13D:
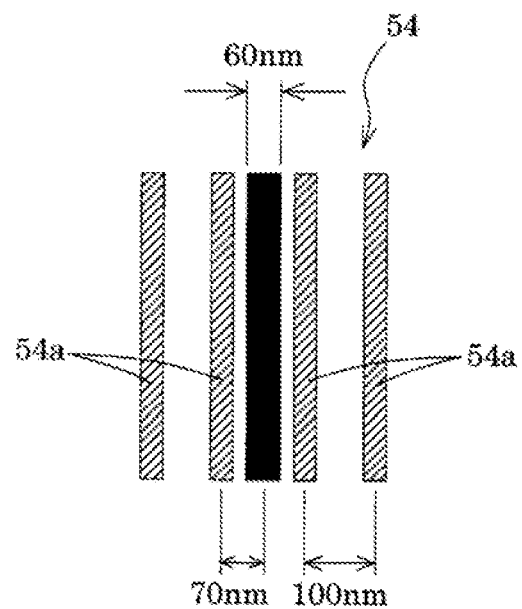

In FIGS. 13C and 13D, hatched strip-shaped sections 53$a$, 54$a$ do not form a part of pattern images 53 and 54, but show that patterns for optical proximity effect are formed in areas corresponding to strip-shaped sections 53$a$ and 54$a$ in the pattern area of mask M. A mask pattern 51$m$ (not shown) corresponding to pattern image 51 is a so-called anchor pattern, and a slice level of the light intensity distribution formed by mask pattern 51$m$ is decided so that the line width of the resist pattern formed by mask pattern 51$m$ becomes 50 nm which is a desired value.

Then, under a slice level decided for pattern image 51, an error $\Delta$CD (line width error from a target) from a desired value of the line width of the resist pattern formed by mask patterns 52$m$, 53$m$, and 54$m$ (not shown) corresponding to pattern images 52, 53, and 54 is acquired as an index value of image-forming properties. That is, in the evaluation method of the second embodiment, as the index value of image-forming properties, line width of the pattern obtained from the pupil luminance distribution is acquired. For reference, in the evaluation method (S11 to S14) of the improving method described referring to FIG. 2, the OPE value (to be more specific, an OPE curve which expresses pattern dependency of line width error $\Delta$CD when the pitch of the pattern is changed) is acquired as the index value of image-forming properties.

In the evaluation method of the second embodiment, as shown in the flow chart of FIG. 11, unit intensity distribution formed on the image plane of the projection optical system by light of a unit luminance level supplied from each area of a plurality of unit pupil areas obtained from virtually dividing the illumination pupil is acquired for each unit pupil area (S31). Step S31 corresponds to step S11 in the improving method of FIG. 2. That is, in step S31, as shown in FIG. 3, by virtually dividing the pupil plane along two directions orthogonal to each other in the illumination pupil plane, that is, in the $\xi$ direction and the $\eta$ direction, a plurality of rectangular-shaped unit pupil areas 41 is obtained.

Then, in step S31, in pupil plane coordinate ($\xi$, $\eta$) of the illumination optical system, unit intensity distribution $I_u$ (x, y, $\xi_n$, $\eta_n$) is acquired that is formed by a unit light source having light of a unit luminance level only at one unit pupil area located at coordinate ($\xi_n$, $\eta_n$). To be more specific, for the four types of mask patterns 51$m$ to 54$m$ described referring to FIGS. 13A-13D, the unit intensity distribution formed by the unit light source having light of a unit luminance level at only one unit pupil area is acquired for each unit pupil area by image-forming calculation.

Next, in the evaluation method of the second embodiment, discrete data of a standard pupil luminance distribution is acquired, according to a three-dimensional model in which each area of the plurality of unit pupil areas has a luminance level expressed by a multiple (including 0 times) of each unit luminance level (S32). Here, the standard pupil luminance distribution is designed pupil luminance distribution 50 having an annular form, as shown in FIG. 12. That is, in step S32, discrete data of the designed pupil luminance distribution is acquired, which is different from step S12 in the improving method of FIG. 2 where the discrete data of the pupil luminance distribution actually formed on the illumination pupil of the illumination optical system is acquired.

As is described, the discrete data of the designed pupil luminance distribution is expressed as an aggregate of 0 or 1 imparted to a unit cube of 256×256×256=16,777,216 as shown, for example, in FIG. 5, and made into a database. In step S32, the pupil luminance distribution actually formed on the illumination pupil does not have to be measured each time, and discrete data acquired in advance (and made into a database) regarding the plurality of designed pupil luminance distributions estimated in advance can also be used.

Next, in the evaluation method of the second embodiment, based on the plurality of unit intensity distributions acquired for each unit pupil area in step S31 and the discrete data of the standard pupil luminance distribution acquired in step S32, light intensity distribution of the aerial image formed on the image plane of the projection optical system by the standard pupil luminance distribution is acquired (S33). Step S33 is a step corresponding to step S13 in the improving method of FIG. 2. That is, in step S33, for the four types of mask patterns 51$m$ to 54$m$ described referring to FIGS. 13A-13D, light intensity distribution of the aerial image obtained corresponding to the standard pupil luminance distribution is acquired by a linear combination of the plurality of unit intensity distributions in which the luminance level of each unit pupil area is used as a coefficient.

Specifically, in step S33, based on the plurality of unit intensity distributions acquired for each unit pupil area for mask pattern 51$m$ in step S31 and the discrete data of the standard pupil luminance distribution acquired in step S32, the light intensity distribution of the aerial image obtained corresponding to mask pattern 51$m$ is acquired by a simple linear combination calculation without performing the image-forming calculation. Similarly, also for mask patterns 52$m$, 53$m$, and 54$m$, the light intensity distributions of the aerial images obtained corresponding to the patterns can be acquired, without performing the image-forming calculations.

Next, in the evaluation method of the second embodiment, based on the light intensity distribution of the aerial image acquired in step S33, an index value of the image-forming properties obtained by the standard pupil luminance distribution is acquired (S34). Specifically, in step S34, as the index value of image-forming properties, line width of the resist patterns obtained by the standard pupil luminance distribution is acquired for each of the four types of mask patterns 51$m$ to 54$m$.

As a consequence, in step S34, for three types of mask patterns 52$m$ to 54$m$ excluding mask pattern 51$m$ as an anchor pattern, line width errors $\Delta$CD of the resist patterns are acquired. As described above, because the slice level of the light intensity distribution is decided so that the line width of the resist pattern formed by mask pattern 51$m$ becomes 50 nm which is the desired value, line width error $\Delta$CD of the resist pattern does not occur for mask pattern 51$m$.

Next, in the evaluation method of the second embodiment, in the discrete data of the standard pupil luminance distribution acquired in step S32, unit change amount of the index value which is obtained when luminance level of one unit pupil area changes only by a unit luminance level is acquired for each unit pupil area (S35). Specifically, in step S35, for a plurality of unit pupil areas that is selected, the unit change amount of the line width of the resist pattern when the luminance level changes only by a unit luminance level is acquired with respect to the three types of mask patterns 52m to 54m for each unit pupil area.

FIG. 14A shows a distribution 56b of a unit change amount of a pattern line width acquired for each unit pupil area, for mask pattern 52m corresponding to pattern image 52 in FIG. 13B. FIG. 14B shows a distribution 56c of a unit change amount of a pattern line width acquired for each unit pupil area, for mask pattern 53m corresponding to pattern image 53 in FIG. 13C. FIG. 14C shows a distribution 56d of a unit change amount of a pattern line width acquired for each unit pupil area, for mask pattern 54m corresponding to pattern image 54 in FIG. 13D.

In FIGS. 14A to 14C, when the color in each unit pupil area nears white, it means that the unit change amount of the pattern line width increases in a positive direction (a direction in which the line width becomes wider), and when the color nears black, it means that the unit change amount of the pattern line width increases in a negative direction (a direction in which the line width becomes smaller). As is described, distributions 56b to 56d of the unit change amount of the pattern line width acquired for each unit pupil area are sensitivity distributions (unit: nm/%) concerning the pattern line width when the luminance level of each unit pupil area changes only by a unit luminance level.

When referring to FIGS. 14A to 14C, it becomes possible to easily grasp how the change in the luminance level in which unit pupil area causes the pattern line width to change, for mask patterns 52m to 54m. Incidentally, as is described above, because mask pattern 51m is an anchor pattern, line width error ΔCD of the resist pattern for mask pattern 51m is zero, and the sensitivity distribution also becomes 0, therefore, drawings thereabout are omitted.

Figure 15:
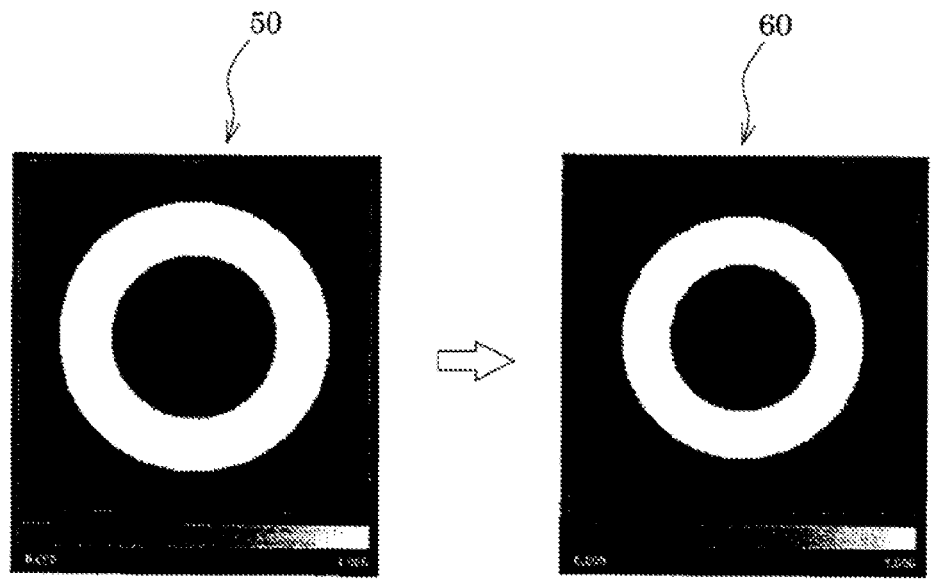
FIG. 15 is a view showing a state where an annular pupil luminance distribution is actually formed with the designed pupil luminance distribution serving as a target.

Next, in the evaluation method of the second embodiment, the pupil luminance distribution formed on the illumination pupil is measured, and based on the measurement results and the three-dimensional model, discrete data of the measured pupil luminance distribution is acquired (S36). That is, in step S36, as shown in FIG. 15, a pupil luminance distribution 60 which is actually formed on the illumination pupil of the illumination optical system is measured with designed pupil luminance distribution 50 serving as a target. On measurement of the pupil luminance distribution, pupil distribution measurement device DT attached to mask stage MS can be used. Control section CR, based on measurement results of pupil distribution measurement device DT, acquires discrete data of an approximated pupil luminance distribution according to the three-dimensional model shown in FIG. 5.

As is previously described, the actual pupil luminance distribution formed on the illumination pupil using spatial light modulator 30 having a large number of mirror elements 30a becomes a distribution slightly different from the attempt to form the standard pupil luminance distribution on the illumination pupil. In the second embodiment, as an example of simplifying the understanding of its working effect, a case is assumed in which pupil luminance distribution 60 which is actually formed on the illumination pupil and designed pupil luminance distribution 50 are similar to each other, and with respect to illumination σ value (=mask side numerical aperture of the illumination optical system/ mask side numerical aperture of the projection optical system) corresponding to designed pupil luminance distribution 50, illumination σ value corresponding to the actual pupil luminance distribution 60 is smaller only by 0.1.

Next, in the evaluation method of the second embodiment, a difference between the discrete data of the standard pupil luminance distribution acquired in step S32 and the discrete data of the measured pupil luminance distribution acquired in step S36 is acquired for each unit pupil area, and a change amount of the index value corresponding to this difference is acquired for each unit pupil area (S37). In step S37, as shown in FIG. 15, because it is assumed that designed pupil luminance distribution 50 and the actual pupil luminance distribution 60 are similar, as a distribution of the difference between the discrete data of standard pupil luminance distribution 50 and the discrete data of the actual pupil luminance distribution 60, a distribution 57 having a property shown in FIG. 16 is obtained.

Figure 16:
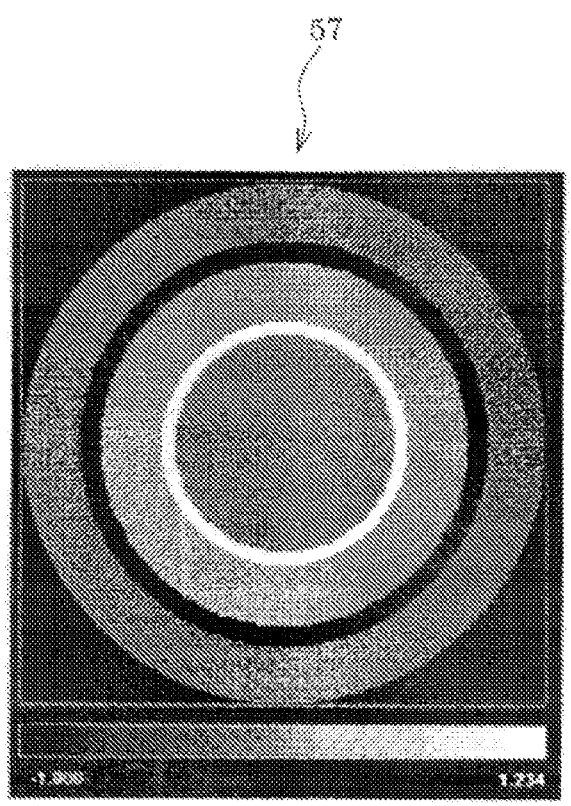
FIG. 16 is a view showing an example of a distribution of a difference between discrete data of a standard pupil luminance distribution and discrete data of the pupil luminance distribution actually formed.
Figure 17:
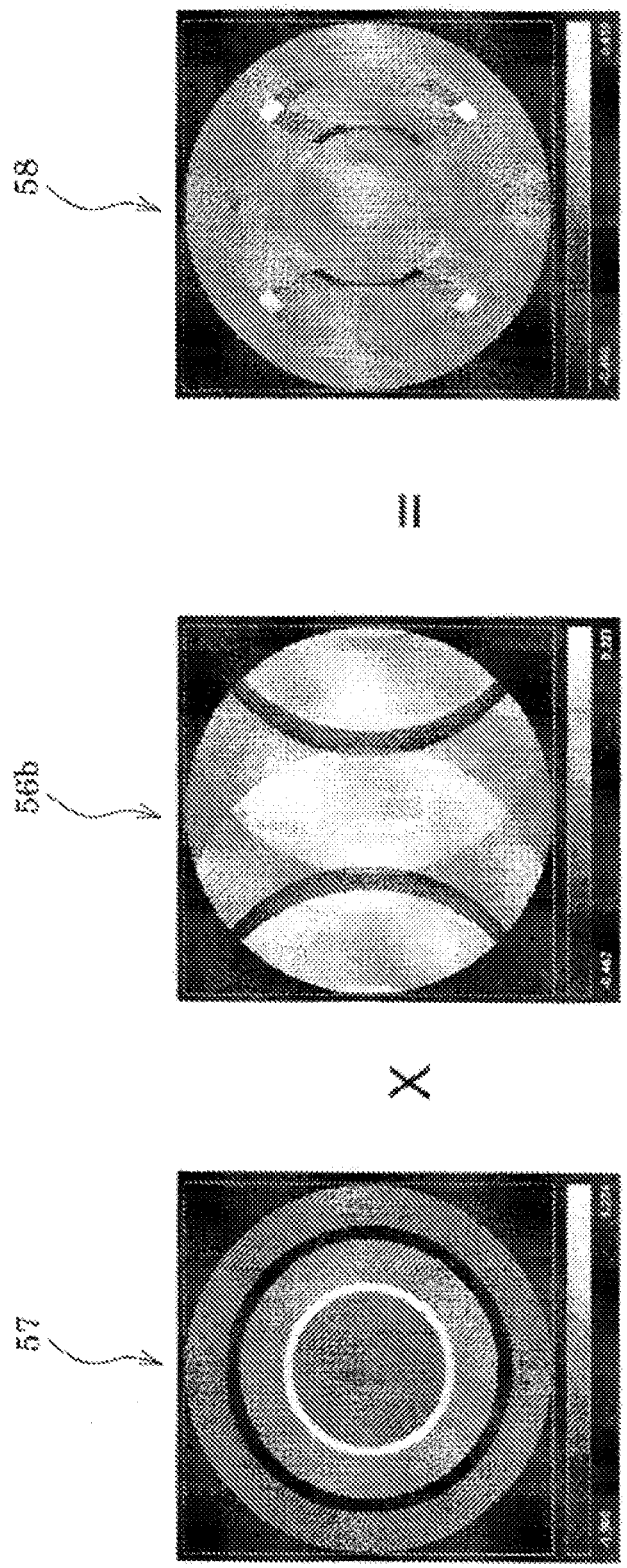
FIG. 17 is a view showing a distribution of a line width change amount obtained by acquiring the change amount of the pattern line width corresponding to the difference distribution in FIG. 16 for each unit pupil area.

Then, in step S37, for mask patterns 52m to 54m, a change amount of the index value corresponding to difference distribution 57 as shown in FIG. 16, that is, a change amount of the line width for the resist pattern is acquired for each unit pupil area. To be more specific, as shown in FIG. 17, based on difference distribution 57 between the discrete data of standard pupil luminance distribution 50 and the discrete data of the actual pupil luminance distribution 60, and for example, distribution 56b of the unit change amount of the pattern line width for mask pattern 52m acquired in step S35 for each unit pupil area, change amount of the pattern line width corresponding to difference distribution 57 is acquired for each unit pupil area, and a distribution 58 of the change amount of the pattern line width is acquired.

Similarly, for other mask patterns 53m and 54m, based on distributions 56c and 56d of the unit change amounts of the pattern line width acquired for each unit pupil area in step S35, change amount of the pattern line width corresponding to difference distribution 57 is acquired for each unit pupil area, and consequently, distribution of the change amount of the pattern line width is acquired. In distribution 58 of the line width change amount in FIG. 17, similarly as in the case of FIGS. 14A to 14C, when the color of each unit pupil area nears white, it means that the unit change amount of the pattern line width increases in a positive direction (a direction in which the line width becomes wider), and when the color nears black, it means that the unit change amount of the pattern line width increases in a negative direction (a direction in which the line width becomes smaller).

Finally, in the evaluation method of the second embodiment, from a total sum of the change amount (change amount of the line width) of the index value corresponding to the difference acquired for each unit pupil area in step S37, an error (line width error of the pattern) from the target index value of the index value obtained corresponding to the measured pupil luminance distribution is acquired (S38). That is, in step S38, by calculating the total sum of the line width change amount in distribution 58 of the line width change amount shown in FIG. 17, for example, line width error ΔCD of the resist pattern generated corresponding to mask pattern 52m is acquired. Similarly, line width error ΔCD of the resist pattern generated corresponding to other mask patterns 53m and 54m can also be acquired.

In the evaluation method of the second embodiment, when acquiring line width error ΔCD of the resist pattern generated corresponding to, for example, mask pattern 52m, the total sum of the line width change amount in distribution 58 is calculated. When referring to distribution 58 of the line width change amount subject to this total sum calculation, it becomes easy to grasp which difference of pupil luminance in a unit pupil area is dominant when line width error ΔCD is generated. Similarly, also for other mask pattern 53m and 54m, it becomes easy to grasp which difference of pupil luminance in a unit pupil area is dominant when line width error ΔCD is generated.

That is, when referring to distribution 58 of the line width change amount for mask pattern 52m, it becomes easy to grasp what level of change in the pupil luminance level in which unit pupil area increases or decreases the line width of the resist pattern obtained corresponding to mask pattern 52m, and the extent of the increase or decrease. Similarly, when referring to the distribution of the line width change amount for other mask patterns 53m and 54m, it becomes easy to grasp what level of change in the pupil luminance level in which unit pupil area increases or decreases the line width of the resist patterns obtained corresponding to mask patterns 53m and 54m, and the extent of the increase or decrease.

In this manner, in the evaluation method of the second embodiment, based on information on line width error ΔCD of the resist patterns that occur corresponding to mask patterns 52m to 54m, which are patterns other than anchor pattern 51m, and information on the dominant difference that can easily be grasped referring to the distribution of line width change amount (that is, information on which difference of pupil luminance in a unit pupil area is dominant when line width error ΔCD occurs), the pupil luminance distribution formed on the illumination pupil can be adjusted so that line width errors with respect to the plurality of mask patterns fall within a desired range. That is, for example, an engineer can totally evaluate the pupil luminance distribution formed on the illumination pupil of the illumination optical system using the evaluation method of the second embodiment, and can adjust the pupil luminance distribution formed on the illumination pupil based on the evaluation results.

Figure 18:
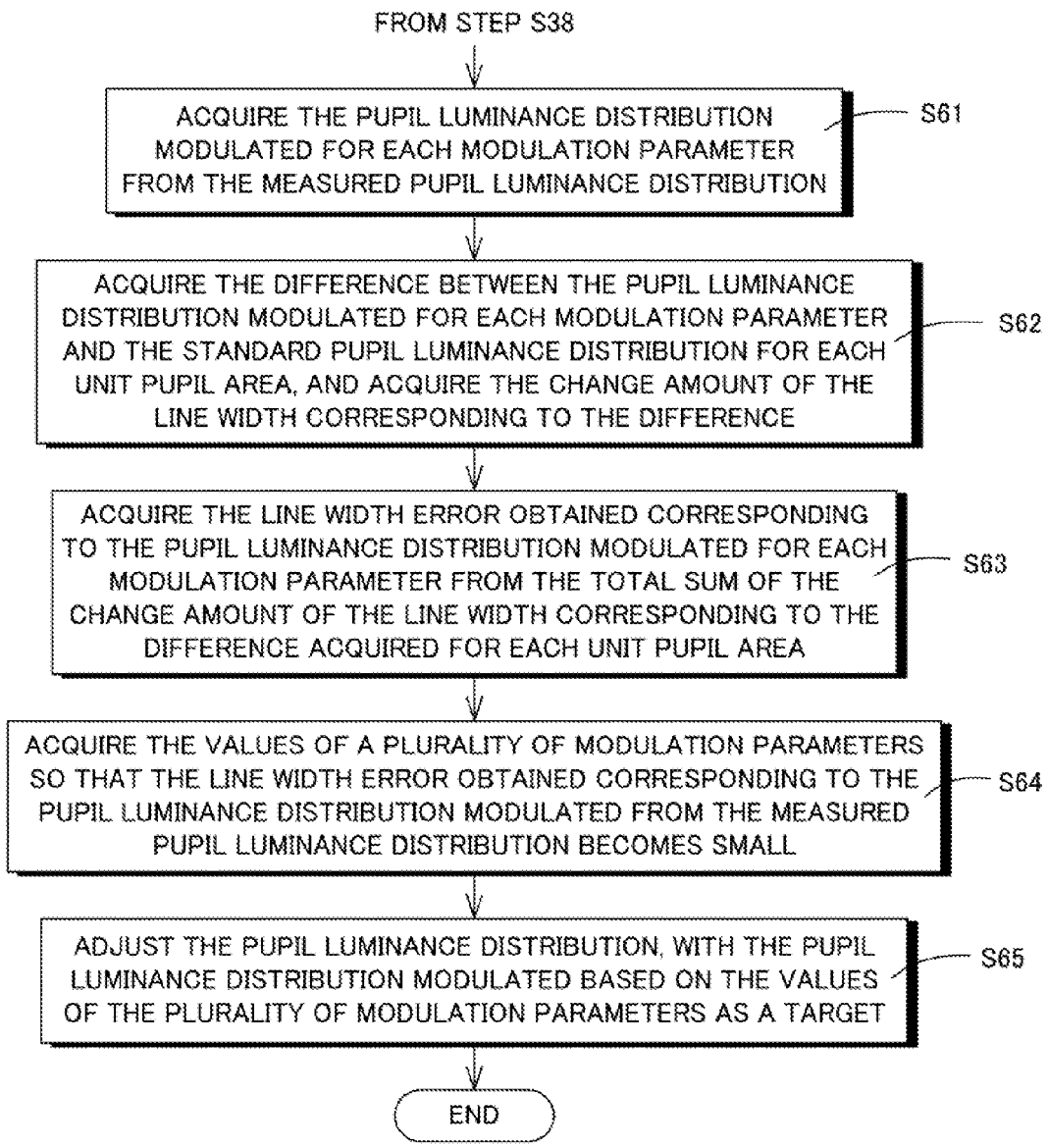
FIG. 18 is a flow chart showing an adjustment process of the pupil luminance distribution formed on an illumination pupil which is performed after going through the evaluation method of the pupil luminance distribution related to the second embodiment.

Alternatively, after evaluating the pupil luminance distribution using the evaluation method of the second embodiment consisting of steps S31 to S38 described above, by performing steps S61 to S65 shown in FIG. 18, the pupil luminance distribution can be adjusted, and consequently, illumination optical system IL can also be adjusted. In the adjustment method related to the second embodiment, as shown in FIG. 18, after going through steps S31 to S38 in the evaluation method of the second embodiment, a modulation model defined by a plurality of modulation parameters is set, and discrete data of the pupil luminance distribution modulated for each modulation parameter from measured discrete data of the pupil luminance distribution is acquired (S61).

Hereinafter, the modulation model defined by a plurality of modulation parameters will be described. In the second embodiment, a relation between a pupil luminance distribution $\Psi m(\xi, \eta)$ which is actually measured and a pupil luminance distribution $\Psi m'(\xi, \eta)$ modulated from the measured pupil luminance distribution $\Psi m(\xi, \eta)$ will be made concrete, using a compound operation information due to several types of modulation operations which will be described later on and a parameter group which expresses each modulation operation (density of transmittance, types of distribution and the like). In general, a relation shown by formula (4) below is valid between the measured pupil luminance distribution $\Psi m(\xi, \eta)$ and the modulated pupil luminance distribution $\Psi m'(\xi, \eta)$. In formula (4), Q[ ] is a modulation operation in which a realistic model of some kind was reflected, and $Q_1, Q_2, \ldots, Q_i$ are a plurality of modulation factors (modulation parameters of the pupil luminance distribution).

$$\Psi m'(\xi,\eta)=Q[\Psi m(\xi,\eta),Q1,Q2,\ldots,Qi] \tag{4}$$

As an example of a model for this modulation operation and modulation factors, a representative distribution modulation operation by an optical system, that is, an operation of transmittance modulation and an operation of distortion modulation can be considered. In the case of transmittance modulation (modulation corresponding to transmittance distribution), the relation between the measured pupil luminance distribution $\Psi m (\xi, \eta)$ and the modulated pupil luminance distribution $\Psi m' (\xi, \eta)$ is expressed as shown in formula (5) below.

$$\Psi m'(\xi,\eta)=T(\xi,\eta)\Psi m(\xi,\eta) \tag{5}$$

Here, $T(\xi, \eta) \equiv \exp[\Sigma Q_i \times f_i (\xi, \eta)]$

In formula (5), $T(\xi, \eta)$ indicates net transmittance distribution function, and $f_i (\xi, \eta)$ indicates a Fringe Zernike polynomial. Further, in formula (5), $\Sigma$ is a reference code for a total sum of 1 to i. In the case there is no transmittance modulation at all, an expansion coefficient $Q_i$ of each order of the Fringe Zernike polynomial $f_i (\xi, \eta)$ is 0, and transmittance distribution function $T(\xi, \eta)$ becomes 1.

In the case of distortion modulation (modulation corresponding to deformation of pupil luminance distribution), pupil coordinate values $\xi', \eta'$ after modulation are expressed as in formulas (6a) and (6b) below, using pupil coordinate values $\xi, \eta$ before modulation and functions $D\xi, D\eta$.

$$\xi'=\xi+D\xi(\xi,\eta) \tag{6a}$$

$$\eta'=\eta+D\eta(\xi,\eta) \tag{6b}$$

Formulas (6a) and (6b) indicate an operation in which each position of beams within the pupil plane before modulation ($\xi, \eta$) (corresponds to each pixel numerically) performs small movement to each position ($\xi', \eta'$) defined based on distortion functions $D\xi, D\eta$. By this, a modulation operation consequently occurs of the pupil luminance distribution based on, for example, a distortion operation (distortion, modification of distribution) characterized by pincushion or barrel. For the distortion modulation operation, a specific definition is possible by an expression using the Fringe Zernike polynomial $f_i (\xi, \eta)$.

For example, in the case there is a modulation operation only of a four-order distortion polynomial (Dist-4), functions $D\xi$ and $D\eta$ are expressed as in formulas (7a) and (7b) below.

$$D\xi(\xi,\eta)=Q4\times\{f2(\xi,\eta)\} \tag{7a}$$

$$D\eta(\xi,\eta)=Q4\times\{-f3(\xi,\eta)\} \tag{7b}$$

Here, $Q_4$ corresponds to a four-order expansion coefficient of the distortion polynomial, and the magnitude of the four-order distortion operation is decided depending on the amount of this numerical value $Q_4$. In Table (1) below, a first-order distortion polynomial (Dist-1) to a 55th-order distortion polynomial (Dist-55) is shown. In table (1), Fi indicates $f_i (\xi, \eta)$. Further, in table (1), DX is a unit vector indicating that modulation is performed with pupil plane coordinate $\xi$ as the subject, and DY is a unit vector indicating that modulation is performed with pupil plane coordinate $\eta$ as the subject.

TABLE (1)

| | |
|---|---|
| Dist-1 | F1 * DX |
| Dist-2 | F1 * DY |
| Dist-3 | F2 * DX + F3 * DY |
| Dist-4 | F2 * DX − F3 * DY |
| Dist-5 | F3 * DX + F2 * DY |
| Dist-6 | F4 * DX |
| Dist-7 | F4 * DY |
| Dist-8 | F5 * DX + F6 * DY |
| Dist-9 | F6 * DX − F5 * DY |

TABLE (1)-continued

| | |
|---|---|
| Dist-10 | F5 * DX − F6 * DY |
| Dist-11 | F6 * DX + F5 * DY |
| Dist-12 | F7 * DX + F8 * DY |
| Dist-13 | F7 * DX − F8 * DY |
| Dist-14 | F8 * DX + F7 * DY |
| Dist-15 | F10 * DX + F11 * DY |
| Dist-16 | F11 * DX − F10 * DY |
| Dist-17 | F10 * DX − F11 * DY |
| Dist-18 | F11 * DX + F10 * DY |
| Dist-19 | F9 * DX |
| Dist-20 | F9 * DY |
| Dist-21 | F12 * DX + F13 * DY |
| Dist-22 | F13 * DX − F12 * DY |
| Dist-23 | F12 * DX − F13 * DY |
| Dist-24 | F13 * DX + F12 * DY |
| Dist-25 | F17 * DX + F18 * DY |
| Dist-26 | F18 * DX − F17 * DY |
| Dist-27 | FI7 * DX − F18 * DY |
| Dist-28 | F18 * DX + F17 * DY |
| Dist-29 | F14 * DX + F15 * DY |
| Dist-30 | F14 * DX − F15 * DY |
| Dist-31 | F15 * DX + F14 * DY |
| Dist-32 | F19 * DX + F20 * DY |
| Dist-33 | F20 * DX − F19 * DY |
| Dist-34 | F19 * DX − F20 * DY |
| Dist-35 | F20 * DX + F19 * DY |
| Dist-36 | F26 * DX + F27 * DY |
| Dist-37 | F27 * DX − F26 * DY |
| Dist-38 | F16 * DX |
| Dist-39 | F16 * DY |
| Dist-40 | F21 * DX + F22 * DY |
| Dist-41 | F22 * DX − F21 * DY |
| Dist-42 | F21 * DX − F22 * DY |
| Dist-43 | F22 * DX + F21 * DY |
| Dist-44 | F28 * DX + F29 * DY |
| Dist-45 | F29 * DX − F28 * DY |
| Dist-46 | F23 * DX + F24 * DY |
| Dist-47 | F23 * DX − F24 * DY |
| Dist-48 | F24 * DX + F23 * DY |
| Dist-49 | F30 * DX + F31 * DY |
| Dist-50 | F31 * DX − F30 * DY |
| Dist-51 | F25 * DX |
| Dist-52 | F25 * DY |
| Dist-53 | F32 * DX + F33 * DY |
| Dist-54 | F33 * DX − F32 * DY |
| Dist-55 | F34 * DX + F35 * DY |

Figure 19:
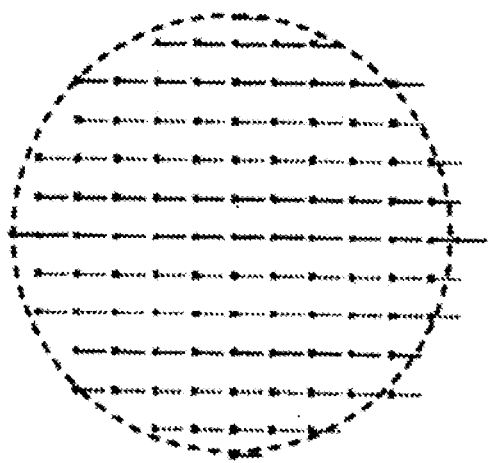
FIG. 19 is a view showing a modulation operation according to only a first-order distortion polynomial.
Figure 20:
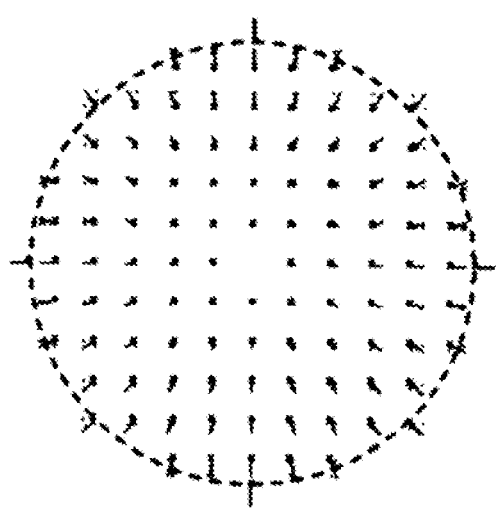
FIG. 20 is a view showing a modulation operation according to only a third-order distortion polynomial.
Figure 21:
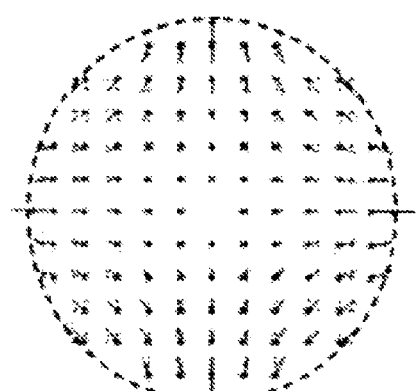
FIG. 21 is a view showing a modulation operation according to only a fourth-order distortion polynomial.
Figure 22:
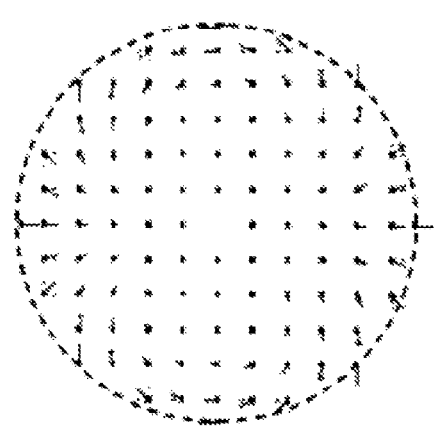
FIG. 22 is a view showing a modulation operation according to only an eighth-order distortion polynomial.
Figure 23:
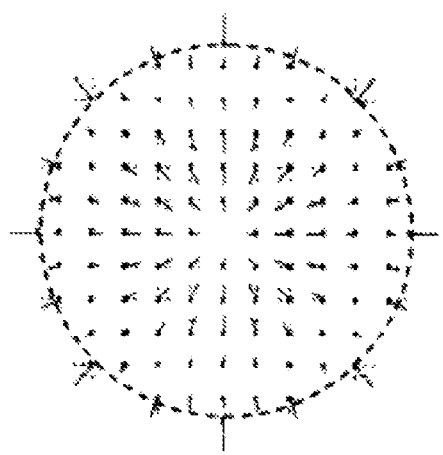
FIG. 23 is a view showing a modulation operation according to only a twelfth-order distortion polynomial.

For reference, the modulation operation only by the first-order distortion polynomial (Dist-1) is shown in FIG. 19, the modulation operation only by the third-order distortion polynomial (Dist-3) is shown in FIG. 20, the modulation operation only by the fourth-order distortion polynomial (Dist-4) is shown in FIG. 21, the modulation operation only by the eighth-order distortion polynomial (Dist-8) is shown in FIG. 22, and the modulation operation only by the twelfth-order distortion polynomial (Dist-12) is shown in FIG. 23.

Accordingly, a general modulation operation using the distortion polynomial can be expressed as formulas (8a) and (8b) below, as a mixing effect of the distortion modulation of a plurality of orders. In formulas (8a) and (8b), $D_i$ is a distortion polynomial (vector expression) of each order defined in table (1), and DX and DY are unit vectors whose subjects are pupil plane coordinates $\xi$, $\eta$. Further, in formulas (8a) and (8b), $\Sigma$ is a reference code for the total sum of 1 to i, and "·" indicates an inner product of a vector.

$$\xi' = \Sigma Q_i \times \{D_i(\xi,\eta) \cdot DX\} \quad (8a)$$

$$\eta' = \Sigma Q_i \times \{D_i(\xi,\eta) \cdot DY\} \quad (8b)$$

In the distortion polynomial defined in table (1), the modulation operation of each order corresponds to an operation orthogonal to each other. Incidentally, other than the two types of models described above, models concerning modulation corresponding to aberration other than distortion, modulation corresponding to blur effect, modulation corresponding to flare light, modulation corresponding to exposure dose amount and the like may also be added when necessary.

Further, models concerning modulation corresponding to the NA (numerical aperture) of the image-forming optical system (for example, the projection optical system in the exposure apparatus), modulation corresponding to defocus (for example, defocus of the resist surface with respect to the image-forming surface of the projection optical system in the exposure apparatus) with respect to the image-forming optical system, modulation corresponding to spherical aberration and the like may also be added when necessary. Furthermore, by combining these modulation models, a modulation operation of a more practical pupil luminance distribution can be expressed.

As an example, a relation between the measured pupil luminance distribution $\Psi m(\xi, \eta)$ and the modulated pupil luminance distribution $\Psi m'(\xi, \eta)$ can be modeled as shown in formula (9) below. In formula (9), PSF is a function expressing a blur effect (for example, a Gaussian function), F is an illumination flare component which evenly affects the entire pupil plane, and "*" expresses a convolution.

$$\Psi m'(\xi,\eta) = T(\xi,\eta)[\Psi m\{\xi + D\xi(\xi,\eta), \eta + D\eta(\xi,\eta)\} * PSF] + F \quad (9)$$

In the second embodiment, because four types of mask patterns $51m$ to $54m$ to be evaluated are assumed, a physical quantity to be noted on adjustment of the pupil luminance distribution is the difference between a line width which is a desired target index value to be achieved by a designed (standard) pupil luminance distribution $\Psi d(\xi, \eta)$ and a line width which is an index value obtained from pupil luminance distribution $\Psi m'(\xi, \eta)$ modulated from measured pupil luminance distribution $\Psi m(\xi, \eta)$, that is, line width error $\Delta CD$.

Here, the CD value corresponding to the modulated pupil luminance distribution $\Psi m'(\xi, \eta)$ is minutely changed from the CD value corresponding to the measured pupil luminance distribution $\Psi m(\xi, \eta)$, depending on a plurality of modulation parameters (that is, coefficient) $Q_1, Q_2, \ldots, Q_i$ that decide a small change from measured pupil luminance distribution $\Psi m(\xi, \eta)$. In general, the relation between modulation parameters $Q_1, Q_2, \ldots, Q_i$ described above and line width error $\Delta CD$ is a complex nonlinear relation. However, in the case of considering a small change from zero of line width error $\Delta CD$ when modulation parameter $Q_i$ has a finite value by a minute amount, the relation between modulation parameter $Q_i$ and line width error $\Delta CD$ can be treated as an approximately linear change relation.

In step S61, a modulation model is set which is defined by a plurality of modulation parameters as is described above. Then, discrete data of the pupil luminance distribution finely modulated from discrete data of the measured pupil luminance distribution is acquired for each modulation parameter. Specifically, in step S61, by giving a required minute value to a noted modulation parameter (coefficient) and giving a zero value to all other modulation parameters, discrete data of the pupil luminance distribution finely modulated from the discrete data of the measured pupil luminance distribution is acquired. The operation of acquiring the discrete data of the finely modulated pupil luminance distribution is repeated for all of the modulation parameters, or for a required plurality of modulation parameters.

Next, in the adjustment method of the second embodiment, a difference between discrete data of the pupil luminance distribution modulated for each modulation parameter obtained in step S61 and discrete data of the standard pupil luminance distribution is acquired for each unit pupil area, and a change amount of the index value corresponding to this difference is acquired for each unit pupil area (S62). This step S62 is similar to step S37 in the evaluation method of the second embodiment. That is, in step S62, based on a difference distribution between discrete data of designed pupil luminance distribution 50 and discrete data of the pupil luminance distribution modulated for each modulation parameter (corresponding to difference distribution 57 shown in FIG. 16), and distribution 56b of the unit change amount of the pattern line width acquired for each unit pupil area in step S35, for example, for mask pattern 52m, a change amount of the pattern line width corresponding to the difference distribution is acquired for each unit pupil area, and consequently a distribution of the change amount of the pattern line width is acquired.

Similarly, for other mask patterns 53m and 54m, based on distributions 56c and 56d of the unit change amount of the pattern line width acquired in step S35 for each unit pupil area, change amount of the pattern line width corresponding to the difference distribution between discrete data of designed pupil luminance distribution 50 and discrete data of the pupil luminance distribution modulated for each modulation parameter is acquired for each unit pupil area, and consequently, the distribution of the change amount of pattern line width is acquired. As is described, the operation for acquiring the distribution of the change amount of the pattern line width for mask patterns 52m to 54m is performed for the pupil luminance distribution modulated for each modulation parameter.

Next, in the adjustment method of the second embodiment, from a total sum of the change amount of the index values corresponding to the difference acquired for each unit pupil area in step S62, an error from the target index value of the index value obtained corresponding to the pupil luminance distribution modulated for each modulation parameter is acquired (S63). This step S63 is similar to step S38 in the evaluation method of the second embodiment. That is, in step S63, by calculating the total sum of the line width change amount in the distribution of the line width change amount acquired in step S62 (corresponding to distribution 58 shown in FIG. 17), line width error ΔCD of the resist pattern generated corresponding to, for example, mask pattern 52m, is acquired for the pupil luminance distribution modulated for each modulation parameter. Similarly, line width error ΔCD of the resist pattern generated corresponding to other mask patterns 53m and 54m is also acquired for the pupil luminance distribution modulated for each modulation parameter.

Next, in the adjustment method of the second embodiment, values of the plurality of modulation parameters are acquired so that errors from the target index value of the index value obtained corresponding to the pupil luminance distribution modulated from the measured pupil luminance distribution becomes smaller instead of errors from the target index value of the index value obtained corresponding to the measured pupil luminance distribution (S64). Specifically, in step S64, values of the plurality of modulation parameters are acquired using techniques such as, for example, a nonlinear least squares method, so that line width error ΔCD obtained corresponding to the modulated pupil luminance distribution becomes sufficiently small, that is, line width error ΔCD obtained corresponding to the modulated pupil luminance distribution falls within a permissible range.

Finally, in the adjustment method of the second embodiment, the pupil luminance distribution formed on the illumination pupil is adjusted, based on the values of the plurality of modulation parameters acquired in step S64 with the modulated pupil luminance distribution serving as a target (S65). Specifically, in step S65, by control section CR controlling the attitude of each of the plurality of mirror elements 30a of spatial light modulator 30 while referring to the measurement results of pupil distribution measurement device DT, a pupil luminance distribution as close as possible to the pupil luminance distribution modulated based on the values of the plurality of modulation parameters acquired in step S64 is formed on the illumination pupil, and consequently the pupil luminance distribution formed on the illumination pupil of illumination optical system IL is adjusted.

Incidentally, after step S65, if necessary, test exposure can be performed based on the adjusted pupil luminance distribution, and by actually measuring the line width of the resist pattern formed on wafer W installed on the image plane of projection optical system PL, line width error ΔCD can be checked so that it stays within a permissible range. As is described, in the adjustment method related to the second embodiment, by executing steps S61 to S65 after evaluating the pupil luminance distribution using the evaluation method related to the second embodiment (S31 to S38), the pupil luminance distribution can be adjusted, and consequently, illumination optical system IL can be adjusted.

Incidentally, in the evaluation method of the pupil luminance distribution related to the second embodiment, as the designed pupil luminance distribution, annular pupil luminance distribution 50 shown in FIG. 12 is assumed, and also one anchor pattern 51m and three mask patterns 52m to 54m are assumed. However, the present invention is not limited to this, and various forms are possible in the designed pupil luminance distribution (standard pupil luminance distribution) and the evaluation pattern. Further, in the second embodiment, as the index value of image-forming properties, the line width of the resist pattern obtained by the pupil luminance distribution is acquired. However, the present invention is not limited to this, and an appropriate index value other than the line width of the pattern can also be used.

In the embodiment described above, pupil distribution measurement device DT measures the light intensity distribution on the surface optically conjugate to the illumination pupil of illumination optical system IL (the pupil plane of image-forming optical system 8), based on the light having passed through the irradiation target surface (the pattern surface position of mask M) of illumination optical system IL. However, the present invention is not limited to this, and the light intensity distribution in the surface optically conjugate to the illumination pupil can also be measured, based on the light proceeding toward the irradiation target surface of illumination optical system IL. As an example, by extracting a part of the illumination light from the optical path between micro fly-eye lens 5 and condenser optical system 6, and detecting the extracted light at a surface optically conjugate to the illumination pupil immediately after micro fly-eye lens 5, light intensity distribution corresponding to the pupil luminance distribution on the illumination pupil immediately after the micro fly-eye lens 5 is measured.

Further, in the embodiment described above, K prism 32 integrally formed in one optical block is used as the prism member having an optical surface that faces the arrangement surface of the plurality of mirror elements 30a of spatial light modulator 30. However, the present invention is not limited to this, and by a pair of prisms, a prism member having a function similar to K prism 32 can be configured. Further, by one plane-parallel plate and a pair of triangular prisms, a prism member having a function similar to K prism 32 can be configured. Further, by one plane-parallel plate and a pair of planar mirrors, an assembled optical member having a function similar to K prism 32 can be configured.

In the present embodiment, as spatial light modulator 30, for example, the spatial light modulator is used which continuously changes each of the orientation of the plurality of mirror elements 30a arranged two-dimensionally. As such a spatial light modulator, the spatial light modulator disclosed in, for example, European Patent No. 779530, U.S. Pat. No. 5,867,302, U.S. Pat. No. 6,480,320, U.S. Pat. No. 6,600,591, U.S. Pat. No. 6,733,144, U.S. Pat. No. 6,900,915, U.S. Pat. No. 7,095,546, U.S. Pat. No. 7,295,726, U.S. Pat. No. 7,424,330, U.S. Pat. No. 7,567,375, U.S. Patent Application Publication No. 2008/0309901, U.S. Patent Application Publication No. 2011/0181852, U.S. Patent Application Publication No. 2011/188017 and Japanese Unexamined Patent Application Publication No. 2006-113437, can be used. Incidentally, the orientation of the plurality of mirror elements 5a arranged two-dimensionally can be controlled discretely in a plurality of stages.

In the embodiments described above, as the spatial light modulator having the plurality of mirror elements which are arranged two-dimensionally and are individually controlled, a spatial light modulator is used whose orientation (angle: tilt) of a plurality of reflection surfaces arranged two-dimensionally is individually controlled. However, the present invention is not limited to this, and for example, a spatial light modulator whose height (position) of a plurality of reflection surfaces arranged two-dimensionally is individually controlled can also be used. As such a spatial light modulator, the spatial light modulator disclosed in, for example, U.S. Pat. No. 5,312,513, and FIG. 1d of U.S. Pat. No. 6,885,493, can be used. In these spatial light modulators, forming a two-dimensional height distribution can have a similar effect as the diffractive surface on the incident light. Incidentally, the spatial light modulator having the plurality of reflection surfaces arranged two-dimensionally as is described above, can also be modified according to the disclosures in, for example, U.S. Pat. No. 6,891,655, and U.S. Patent Application Publication No. 2005/0095749.

Further, in the embodiment described above, as the pupil adjustment device for adjusting the pupil luminance distribution formed on the illumination pupil of illumination optical system IL, spatial light modulator 30 of a reflection type is used, having a plurality of mirror elements 30a that are arranged within a predetermined plane and are individually controllable. However, the present invention is not limited to this, and a transmissive spatial light modulator equipped with a plurality of transmissive optical elements which are arranged within a predetermined plane and are individually controllable can also be used.

Further, in the embodiment described above, the present invention is applied to the method of adjusting the illumination optical system installed in the exposure apparatus, that is, to the adjustment method of a single exposure apparatus. In this case, the standard pupil luminance distribution in the improving method is the designed pupil luminance distribution, and the target OPE value is an OPE value which is to be achieved by the designed pupil luminance distribution.

However, the present invention is not limited to this, and the present invention can be applied to an adjustment method in which the purpose is to perform matching with another exposure apparatus (mother unit), that is, to an adjustment method for suppressing variation of the resolution line width which occurs between two different apparatuses. In this case, the standard pupil luminance distribution in the improving method is the pupil luminance distribution used in the mother unit, and the target OPE value is the OPE value obtained from the pupil luminance distribution used in the mother unit. Incidentally, in the examples described above, while each area of the plurality of unit pupil areas was each approximated (digitalized) by a three-dimensional model having a luminance level expressed by a multiple of the unit luminance level, the approximation does not have to be performed by the multiple of the unit luminance level (integer multiple).

In the embodiment described above, a variable pattern formation apparatus can be used which forms a predetermined pattern based on a predetermined electronic data instead of the mask. When such a variable pattern formation apparatus is used, the influence on synchronous accuracy can be suppressed down to the minimum, even if the pattern surface is vertically placed. Incidentally, as the variable pattern formation apparatus, for example, a DMD (Digital Micro-mirror Device) including a plurality of reflection elements which is driven based on a predetermined electronic data can be used. An exposure apparatus using the DMD is disclosed in, for example, Japanese Unexamined Patent Application Publication No. 2004-304135, and International Publication No. 2006/080285 and the corresponding U.S. Patent Application Publication No. 2007/0296936. Further, other than the non-emission type reflective spatial light modulator such as the DMD, a transmissive spatial light modulator can be used, or a spontaneous light emission type image display device can also be used. The teaching of U.S. Patent Application Publication No. 2007/0296936 is referred to and incorporated herein by reference.

The exposure apparatus of the embodiments described above is manufactured by assembling various kinds of subsystems that include the respective constituents which are recited in the claims of the present application so as to keep predetermined mechanical accuracy, electrical accuracy and optical accuracy. In order to secure these various kinds of accuracy, before and after this assembly, adjustment to achieve the optical accuracy for various optical system, adjustment to achieve the mechanical accuracy for various mechanical systems, and adjustment to achieve the electrical accuracy for various electric systems are performed. A process of assembling various subsystems into the exposure apparatus includes, various kinds of mechanical connection, wiring connection of electric circuits, piping connection of pressure circuits, and the like among various types of subsystems. Needless to say, before the process of assembling the various kinds of subsystems into the exposure apparatus, there is a process for assembling each subsystem individually. When the assembly process of the various subsystems into the exposure apparatus is completed, total adjustment is performed, and various kinds of accuracies as the entire exposure apparatus are secured. Incidentally, the making of the exposure apparatus is preferably performed in a clean room where the temperature, the degree of cleanliness and the like are controlled.

Figure 24:
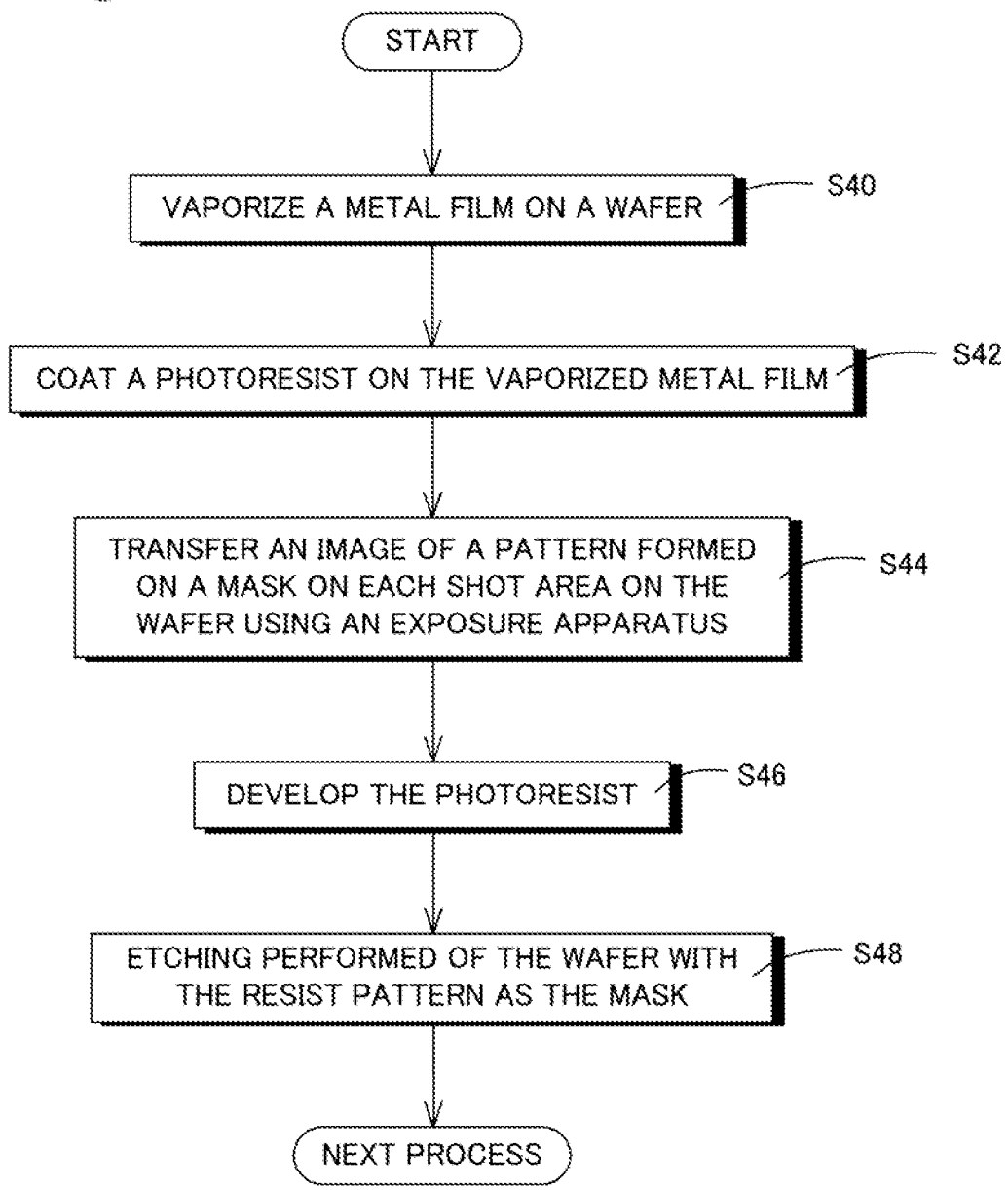
FIG. 24 is a flow chart showing a manufacturing process of a semiconductor device.

Next, a device manufacturing method using the exposure apparatus related to the embodiment described above will be described. FIG. 24 is a flow chart showing a manufacturing process of a semiconductor device. As shown in FIG. 24, in the manufacturing process of semiconductor devices, a metal film is vaporized on a wafer W serving as a substrate of a semiconductor device (step S40), and on this vaporized metal film, a photoresist which is a photosensitive material is coated (step S42). Then, using the projection exposure apparatus of the embodiments described above, the pattern formed on mask (reticle) M is transferred onto each shot area on wafer W (step S44: exposure process), and development of wafer W on which the transfer has been performed, that is, development of the photoresist on which the pattern has been transferred is performed (step S46: development process).

Then, with the resist pattern formed on the surface of wafer W by step S46 serving as a mask, processing such as etching and the like is performed on the surface of wafer W (step S48: fabricate process). Here, the resist pattern is a photoresist layer on which uneven shapes corresponding to the pattern transferred by the projection exposure apparatus of the embodiments described above are formed, and its recess section penetrates the photoresist layer. In step S48, processing of the surface of wafer W is performed via this resist pattern. The processing performed in step S48, for example, includes at least one of etching of the wafer W surface or deposition of a metal film or the like. Incidentally, in step S44, the projection exposure apparatus of the embodiments described above performs transfer of the pattern with wafer W on which the photoresist is coated as a photosensitive substrate.

Figure 25:
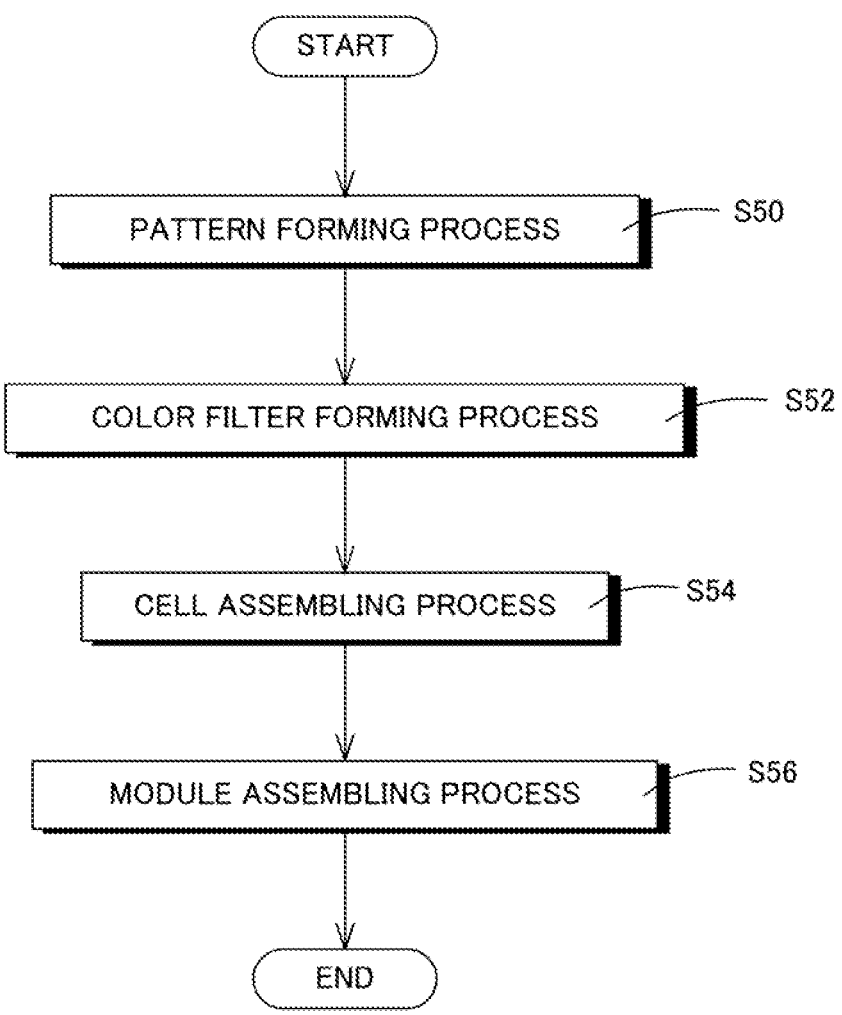
FIG. 25 is a flow chart showing a manufacturing process of a liquid crystal device such as a liquid crystal display device.

FIG. 25 is a flow chart showing a manufacturing process of liquid crystal devices such as a liquid crystal display device and the like. As shown in FIG. 25, in the manufacturing process of liquid crystal devices, a pattern forming process (step S50), a color filter forming process (step S52), a cell assembling process (step S54), and a module assembling process (step S56) are sequentially performed. In the pattern forming process of step S50, on a glass substrate on which a photoresist is coated as plate P, a predetermined pattern such as a circuit pattern, electrode pattern or the like is formed, using the projection exposure apparatus of the embodiment described above. This pattern forming process includes an exposure process in which the pattern is transferred onto the photoresist layer using the projection exposure apparatus in the embodiment, a development process in which development of plate P on which the pattern is transferred, that is, development of the photoresist layer on the glass substrate is performed and a photoresist layer having the shape corresponding to the pattern is generated, and a processing process in which the surface of the glass substrate is processed via the developed photoresist layer.

In the color filter forming process of step S52, a color filter is formed by arranging a number of sets of three dots corresponding to R (Red), G (Green), and B (Blue) in the shape of a matrix, or arranging a plurality of sets of three stripes of filters in R, G, and B in the horizontal scanning direction. In the cell assembling process of step S54, a liquid crystal panel (a liquid crystal cell) is assembled using the glass substrate on which the predetermined pattern is formed in step S50, and the color filter formed in step S52. To be more specific, for example, a liquid crystal panel is formed by injecting a liquid crystal in between the glass substrate and the color filter. In the module assembling process of step S56, to the liquid crystal panel assembled in step S54, various parts such as the electric circuit, backlight and the like which make the liquid crystal panel perform the display operation are attached.

Further, the present invention is not limited to the application for exposure apparatus for manufacturing semiconductor devices, and for example, the present invention can also be widely applied to an exposure apparatus for display devices such as a liquid crystal display device formed on a square-shaped glass plate or a plasma display, or an exposure apparatus for manufacturing various kinds of devices as in an imaging device (such as a CCD), a micromachine, a thin film magnetic head, a DNA chip and the like. Furthermore, the present invention can also be applied to the exposure process (exposure apparatus) when masks (photomasks, reticles and the like) on which mask patterns of various devices are formed are manufactured, using the photolithography process.

Incidentally, in the embodiment described above, as the exposure light, while an ArF excimer laser light (wavelength: 193 nm) or an KrF excimer laser light (wavelength: 248 nm) is used, the present invention is not limited to this, and other appropriate pulse laser light sources, such as for example, an $F_2$ laser light source which supplies a laser light with a wavelength of 157 nm, a $Kr_2$ laser light source which supplies a laser light with a wavelength of 146 nm, an $Ar_2$ laser light source which supplies a laser light with a wavelength of 126 nm or the like can be used. Further, a CW (Continuous Wave) light source which generates an emission line such as a g-line (wavelength 436 nm) or an i-line (wavelength 365 nm) can also be used. Incidentally, the light source of the exposure apparatus in each embodiment above is not limited to the ArF excimer laser, but a pulse laser light source such as a KrF excimer laser (output wavelength: 248 nm), an F2 laser (output wavelength: 157 nm), an Ar2 laser (output wavelength: 126 nm) or a Kr2 laser (output wavelength: 146 nm), or an extra-high pressure mercury lamp that generates an emission line such as a g-line (wavelength: 436 nm), an i-line (wavelength: 365 nm) and the like can also be used. Further, a harmonic wave generating unit of a YAG laser or the like can also be used. Other than this, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, can also be used.

Further, in the embodiment described above, the so-called liquid immersion method can be applied which is a technique wherein the optical path between the projection optical system and the photosensitive substrate is filled with a medium (typically liquid) having a refractive index larger than 1.1. In this case, as a technique for filling the liquid in the optical path between the projection optical system and the photosensitive substrate, a technique of locally filling the liquid as is disclosed in International Publication No. WO99/49504, a technique of making the stage holding a substrate subject to exposure move in a liquid tank as is disclosed in, Japanese Unexamined Patent Application Publication No. 6-124873, a technique of forming a liquid tank having a predetermined depth on the stage and holding the substrate in the tank as is disclosed in Japanese Unexamined Patent Application Publication No. 10-303114 or the like can be employed. The teachings of International Publication No. WO99/49504, Japanese Unexamined Patent Application Publication No. 6-124873 and Japanese Unexamined Patent Application Publication No. 10-303114 are referred to and are incorporated herein by reference.

Further, in the embodiments described above, the so-called polarization illumination method disclosed in U.S. Patent Application Publication Nos. 2006/0170901 and 2007/0146676 can also be applied. The teachings of U.S. Patent Application Publication No. 2006/0170901 and U.S.

Patent Application Publication No. 2007/0146676 are referred to and are incorporated herein by reference.

Further, in the embodiments described above, the present invention is applied to an illumination optical system which illuminates a mask in the exposure apparatus. However, the invention is not limited to this, and the present invention can also be applied in general to an illumination optical system that supplies illumination light to an image-forming optical system which forms an image of an object placed on a first plane on a second plane.

REFERENCE SIGNS LIST 1 light source
2 beam sending section
3 spatial light modulation unit
30 spatial light modulator
30a mirror element
30c driving section
32 K prism
4 relay optical system
5 micro fly-eye lens
6 condenser optical system
7 illumination field stop (mask blind)
8 image-forming optical system
IL illumination optical system
CR controlling section
DT pupil distribution measurement device
M mask
PL projection optical system
W wafer

What is claimed is:

1. An adjustment method of an illumination optical system, the illumination optical system illuminating an irradiation target surface by light from a light source and supplying illumination light to an image-forming optical system that forms an image of a pattern placed on a first plane on a second plane, the method comprising:
adjusting a pupil luminance distribution to be formed on an illumination pupil of the illumination optical system; and
changing the pupil luminance distribution to be formed on the illumination pupil, with the adjusted pupil luminance distribution serving as a target, wherein
the adjusting comprises:
a process of acquiring an index value obtained from a pupil luminance distribution formed on the illumination pupil with a standard pupil luminance distribution serving as a target, using a predetermined evaluation method, wherein
the evaluation method includes:
preparing a variation table that shows a variation of an intensity distribution of the image of the pattern with respect to a change in a pupil luminance for each of a plurality of unit pupil areas, the preparing including a first process of acquiring, for each unit pupil area, a unit intensity distribution formed on the second plane by light of a unit luminance level supplied from each unit pupil area, the plurality of unit pupil areas being obtainable by virtually dividing the illumination pupil;
calculating, by using luminance for each of the plurality of unit pupil areas of the pupil luminance distribution subject to evaluation and the variation table, the intensity distribution of the image of the pattern that is formed on the second plane with light from the pupil luminance distribution subject to evaluation, the calculating including a second process of acquiring discrete data of the pupil luminance distribution wherein each area of the plurality of unit pupil areas is approximated according to a three-dimensional model having a luminance level expressed by a multiple of the unit luminance level, and a third process of acquiring a light intensity distribution of an aerial image formed on the second plane from the pupil luminance distribution, based on a plurality of the unit intensity distributions acquired for each unit pupil area in the first process, and the discrete data acquired in the second process; and
acquiring, by using the calculated intensity distribution of the image, an index value of image-forming property obtained according to the pupil luminance distribution subject to evaluation, the acquiring including a fourth process of acquiring an index value of image-forming property obtained from the pupil luminance distribution, based on the light intensity distribution of the aerial image acquired in the third process, and
the adjusting further comprises:
a process of acquiring a unit change amount of the index value for each unit pupil area when a luminance level of one unit pupil area changes only by a unit luminance level in the discrete data acquired in a preceding process;
a process of acquiring discrete data modulated from the discrete data acquired in the preceding process, by an adjusting technique using the unit change amounts of a plurality of the index values that have been acquired, so as to make an index value obtained from the modulated discrete data approach a target index value; and
a process of acquiring an index value obtained corresponding to the modulated discrete data that has been acquired, using the evaluation method, wherein
by repeatedly performing the process of acquiring the unit change amount of the index value for each unit pupil area, the process of acquiring the discrete data modulated and the process of acquiring the index value until a difference between the index value obtained corresponding to the modulated discrete data and the target index value falls within a permissible range, the pupil luminance distribution to be formed on the illumination pupil is adjusted.

2. The adjustment method according to claim 1, wherein in the first process, by virtually dividing the illumination pupil along two directions that are orthogonal to each other in the illumination pupil, the plurality of unit pupil areas is obtained in rectangular shapes.

3. The adjustment method according to claim 1, wherein in the second process, a pupil luminance distribution formed on the illumination pupil is measured, and the discrete data is acquired based on a result of the measurement.

4. The adjustment method according to claim 1, wherein in the third process, the light intensity distribution of the aerial image is acquired by linear combination of the plurality of unit intensity distributions, with the luminance level of each unit pupil area serving as a coefficient.

5. The adjustment method according to claim 1, wherein in the fourth process, as the index value, line width of a pattern obtained from the pupil luminance distribution is acquired.

6. The adjustment method according to claim 1, wherein in the fourth process, as the index value, an OPE value obtained from the pupil luminance distribution is acquired.

7. The adjustment method according to claim 1, wherein in the process of acquiring the unit change amount of the index value for each unit pupil area, the unit change amount of the index value when the luminance level changes only by the unit luminance level is acquired for each unit pupil area, for a selected plurality of unit pupil areas.

8. The adjustment method according to claim 7, wherein the selected plurality of unit pupil areas is a first group of unit pupil areas having a luminance level that is equal to or more than the unit luminance level, and a second group of unit pupil areas adjacent to the first group of unit pupil areas.

9. The adjustment method according to claim 1, wherein in the process of acquiring the discrete data modulated, the modulated discrete data is acquired by a steepest descent method that refers to mutual ratio of the unit change amount of the index value acquired for each unit pupil area.

10. The adjustment method according to claim 5, wherein a light intensity distribution in a surface optically conjugate to the illumination pupil is measured based on the light having passed through the irradiation target surface, when changing the pupil luminance distribution formed on the illumination pupil with the adjusted pupil luminance distribution serving as a target.

11. The adjustment method according to claim 1, wherein a light intensity distribution in a surface optically conjugate to the illumination pupil is measured based on the light proceeding toward the irradiation target surface, when changing the pupil luminance distribution formed on the illumination pupil with the adjusted pupil luminance distribution serving as a target.

12. The adjustment method according to claim 10, wherein
an index value difference corresponding to a difference between discrete data of the adjusted pupil luminance distribution and discrete data of a measurement result of the light intensity distribution is acquired, when changing the pupil luminance distribution formed on the illumination pupil with the adjusted pupil luminance distribution serving as a target.

13. The adjustment method according to claim 12, wherein
the index value difference corresponding to the difference is acquired by acquiring a unit change amount of an index value when a luminance level of one unit pupil area changes by only a unit luminance level in the discrete data of the adjusted pupil luminance distribution for each unit pupil area, and using a plurality of the unit change amounts of the index values acquired for each unit pupil area.

14. The adjustment method according to claim 12, wherein
a light intensity distribution of the aerial image obtained on the second plane corresponding to the discrete data of the measurement result of the light intensity distribution is acquired, based on the discrete data of the measurement result of the light intensity distribution and the unit intensity distribution acquired for each of the unit pupil areas, and based on the light intensity distribution of the aerial image acquired, the index value difference corresponding to the difference is acquired.

15. The adjustment method according to claim 1, wherein by controlling a spatial light modulator that is equipped in the illumination optical system and also forms the pupil luminance distribution on the illumination pupil, the pupil luminance distribution formed on the illumination pupil is changed with the adjusted pupil luminance distribution serving as a target.

16. An illumination optical system, wherein adjustment is performed by the adjustment method according to claim 1.

17. An exposure apparatus, comprising:
the illumination optical system according to claim 16 to illuminate a predetermined pattern, the apparatus exposing the predetermined pattern on a photosensitive substrate.

18. The exposure apparatus according to claim 17, comprising:
a projection optical system that forms an image of the predetermined pattern on the photosensitive substrate, wherein the illumination pupil is a position optically conjugate to an aperture stop of the projection optical system.

19. The exposure apparatus according to claim 18, wherein
the standard pupil luminance distribution is a pupil luminance distribution used in another exposure apparatus, and the target index value is an index value obtained from the standard pupil luminance distribution in the another exposure apparatus.

20. The exposure apparatus according to claim 17, wherein
the standard pupil luminance distribution is a designed pupil luminance distribution, and the target index value is an index value that should be achieved by the designed pupil luminance distribution.

21. A device manufacturing method comprising:
exposing the predetermined pattern on the photosensitive substrate, using the exposure apparatus according to claim 17;
developing the photosensitive substrate on which the predetermined pattern is transferred, and forming a mask layer with a shape corresponding to the predetermined pattern on a surface of the photosensitive substrate; and
processing the surface of the photosensitive substrate via the mask layer.

22. An exposure method in which a predetermined pattern is illuminated by an illumination optical system adjusted by the adjustment method according to claim 1, and the predetermined pattern is exposed on a photosensitive substrate via a projection optical system, wherein
at least one of a numerical aperture of the projection optical system, a defocus amount of the photosensitive substrate with respect to the projection optical system, and a wavefront aberration of the projection optical system is adjusted so that an index value of image-forming property nears the target index value.

23. An adjustment method of an illumination optical system, the illumination optical system illuminating an irradiation target surface by light from a light source and supplying illumination light to an image-forming optical system that forms an image of a pattern placed on a first plane on a second plane, the method comprising:

evaluating a pupil luminance distribution formed on an illumination pupil of the illumination optical system; and adjusting the pupil luminance distribution formed on the illumination pupil based on a result of the evaluating, wherein the evaluating comprises:

preparing a variation table that shows a variation of an intensity distribution of the image of the pattern with respect to a change in a pupil luminance for each of a plurality of unit pupil areas on the illumination pupil, the preparing including a first process of acquiring, for each of a plurality of unit pupil areas, a unit intensity distribution formed on the second plane by light of a unit luminance level supplied from each unit pupil area, the plurality of unit pupil areas being obtained by virtually dividing the illumination pupil, calculating, by using luminance for each of the plurality of unit pupil areas of the pupil luminance distribution subject to evaluation and the variation table, the intensity distribution of the image of the pattern that is formed on the second plane with light from the pupil luminance distribution subject to evaluation, the calculating including a second process of acquiring discrete data of a standard pupil luminance distribution, according to a three-dimensional model in which each area of the plurality of unit pupil areas has a luminance level expressed by a multiple of the unit luminance level, and a third process of acquiring a light intensity distribution of an aerial image formed on the second plane from the standard pupil luminance distribution, based on the plurality of the unit intensity distributions acquired for each unit pupil area in the first process and the discrete data of the standard pupil luminance distribution acquired in the second process;

acquiring, by using the calculated intensity distribution of the image, an index value of image-forming property obtained according to the pupil luminance distribution subject to evaluation, the acquiring including a fourth process of acquiring an index value of image-forming property obtained from the standard pupil luminance distribution, based on the light intensity distribution of the aerial image acquired in the third process; and acquiring, for each unit pupil area, a unit change amount of the index value obtained when the luminance level of one unit pupil area changes only by a unit luminance level in the discrete data of the standard pupil luminance distribution.

24. The adjustment method according to claim 23, wherein in the first process, by virtually dividing the illumination pupil along two directions that are orthogonal to each other in the illumination pupil, the plurality of unit pupil area is obtained in rectangular shapes.

25. The adjustment method according to claim 23, wherein in the third process, by a linear combination of the plurality of unit intensity distributions with a luminance level of each unit pupil area serving as a coefficient, the light intensity distribution of the aerial image is acquired.

26. The adjustment method according to claim 23, wherein in the fourth process, as the index value, line width of a pattern obtained from the standard pupil luminance distribution is acquired.

27. The adjustment method according to claim 23, wherein in the acquiring, for each unit pupil area, the unit change amount of the index value, the unit change amount of the index value when the luminance level changes only by a unit luminance level is acquired for each unit pupil area, for a selected plurality of unit pupil areas.

28. The adjustment method according to claim 23, wherein the evaluating further comprises measuring the pupil luminance distribution formed on the illumination pupil, and acquiring discrete data of the measured pupil luminance distribution based on a result of the measuring and the three-dimensional model.

29. The adjustment method according to claim 28, wherein the evaluating further comprises acquiring, for each unit pupil area, a difference between discrete data of the standard pupil luminance distribution and discrete data of the measured pupil luminance distribution, and acquiring, for each unit pupil area, a change amount of the index value corresponding to the difference.

30. The adjustment method according to claim 29, wherein in the acquiring, for each unit pupil area, the change amount of the index value, based on the unit change amount of the index value acquired for each unit pupil area and the difference acquired for each unit pupil area, the change amount of the index value corresponding to the difference is acquired for each unit pupil area.

31. The adjustment method according to claim 29, wherein the evaluating further comprises from a total sum of the change amount of the index value corresponding to the difference acquired for each unit pupil area, acquiring an error from a target index value of an index value obtained corresponding to the measured pupil luminance distribution.

32. The adjustment method according to claim 23, wherein the evaluating further comprises:

measuring the pupil luminance distribution formed on the illumination pupil, and acquiring discrete data of the measured pupil luminance distribution, based on a result of the measuring and the three-dimensional model, acquiring, for each unit pupil area, a difference between discrete data of the standard pupil luminance distribution and the discrete data of the measured pupil luminance distribution, and acquiring, for each unit pupil area, a change amount of the index value corresponding to the difference; and from a total sum of the change amount of the index value corresponding to the difference acquired for each unit pupil area, acquiring an error from a target index value of an index value obtained corresponding to the measured pupil luminance distribution, and the adjusting comprises a discrete data acquiring process of setting a modulation model that is defined by a plurality of modulation parameters, and acquiring discrete data of the pupil luminance distribution modulated for each modulation parameter from the discrete data of the measured pupil luminance distribution, a change amount acquiring process of acquiring, for each unit pupil area, a difference between the discrete data of the standard pupil luminance distribution and the discrete data of the pupil luminance distribution modulated for each modulation parameter, and acquiring, for each unit pupil area, a change amount of the index value corresponding to the difference;

an error acquiring process of acquiring from a total sum of the change amount of the index value corresponding to the difference acquired for each unit pupil area, an error from a target index value of an index value obtained corresponding to the pupil luminance distribution modulated for each modulation parameter;

a value acquiring process of acquiring values of the plurality of modulation parameters so that the error from the target index value of the index value obtained corresponding to the pupil luminance distribution modulated from the measured pupil luminance distribution becomes smaller than the error from the target index value of the index value obtained corresponding to the measured pupil luminance distribution; and an adjustment process of adjusting the pupil luminance distribution formed on the illumination pupil, with the pupil luminance distribution modulated from the measured pupil luminance distribution based on the values of the plurality of modulation parameters serving as a target.

33. The adjustment method according to claim 32, wherein
the plurality of modulation parameters include a modulation parameter corresponding to a transmittance distribution.

34. The adjustment method according to claim 32, wherein
the plurality of modulation parameters include a modulation parameter corresponding to aberration.

35. The adjustment method according to claim 34, wherein
as the modulation parameter corresponding to the aberration, a modulation parameter corresponding to deformation of the pupil luminance distribution is used.

36. The adjustment method according to claim 32, wherein
the plurality of modulation parameters include a modulation parameter corresponding to blurring effect.

37. The adjustment method according to claim 32, wherein
the plurality of modulation parameters include a modulation parameter corresponding to flare light.

38. The adjustment method according to claim 32, wherein
when adjusting the pupil luminance distribution formed on the illumination pupil with the modulated pupil luminance distribution serving as a target, a light intensity distribution in a surface optically conjugate to the illumination pupil is measured, based on light that has passed through the irradiation target surface.

39. The adjustment method according to claim 32, wherein
by controlling a spatial light modulator equipped in the illumination optical system that forms the pupil luminance distribution on the illumination pupil, the pupil luminance distribution formed on the illumination pupil is adjusted, with the modulated pupil luminance distribution serving as a target.

40. The adjustment method according to claim 23, wherein
as the index value, line width of a pattern obtained from the pupil luminance distribution is acquired.

41. An illumination optical system, wherein
adjustment is performed by the adjustment method according to claim 23.

42. An exposure method in which a predetermined pattern is illuminated by an illumination optical system adjusted by the adjustment method according to claim 23, and the predetermined pattern is exposed on a photosensitive substrate via a projection optical system, wherein
at least one of a numerical aperture of the projection optical system, a defocus amount of the photosensitive substrate with respect to the projection optical system, and a wavefront aberration of the projection optical system is adjusted so that an index value of image-forming properties nears the target index value.

43. A device manufacturing method comprising:
exposing the predetermined pattern on the photosensitive substrate, using the exposure method according to claim 42;
developing the photosensitive substrate on which the predetermined pattern is transferred, and forming a mask layer with a shape corresponding to the predetermined pattern on a surface of the photosensitive substrate; and
processing the surface of the photosensitive substrate via the mask layer.

44. An illumination optical system that illuminates an irradiation target surface by light from a light source, and supplies illumination light to an image-forming optical system that forms an image of a pattern placed on a first plane on a second plane, the system comprising:
a pupil distribution measurement device that measures a pupil luminance distribution formed on an illumination pupil of the illumination optical system;
a pupil adjustment device that adjusts the pupil luminance distribution formed on the illumination pupil; and
a controller that controls the pupil adjustment device to change the pupil luminance distribution formed on the illumination pupil with the pupil luminance distribution adjusted using an adjustment method, as a target, the adjustment method adjusting a pupil luminance distribution to be formed on the illumination pupil of the illumination optical system, wherein
the adjustment method comprises:
a process of acquiring an index value obtained from a pupil luminance distribution formed on the illumination pupil with a standard pupil luminance distribution serving as a target, using a predetermined evaluation method, wherein
the evaluation method includes:
preparing a variation table that shows a variation of an intensity distribution of the image of the pattern with respect to a change in a pupil luminance for each of a plurality of unit pupil areas, the preparing including a first process of acquiring, for each unit pupil area, a unit intensity distribution formed on the second plane by light of a unit luminance level supplied from each unit pupil area, the plurality of unit pupil areas being obtainable by virtually dividing the illumination pupil;
calculating, by using luminance for each of the plurality of unit pupil areas of the pupil luminance distribution subject to evaluation and the variation table, the intensity distribution of the image of the pattern that is formed on the second plane with light from the pupil luminance distribution subject to evaluation, the calculating including a second process of acquiring discrete data of the pupil luminance distribution wherein each area of the plurality of unit pupil areas is approximated according to a three-dimensional model having a luminance level expressed by a multiple of the unit luminance level, and a third process of acquiring a light intensity distribution of an aerial image formed on the second plane from the pupil luminance distribution, based on a plurality of the unit intensity distributions acquired for each unit pupil area in the first process, and the discrete data acquired in the second process; and acquiring, by using the calculated intensity distribution of the image, an index value of image-forming property obtained according to the pupil luminance distribution subject to evaluation, the acquiring including a fourth process of acquiring an index value of image-forming property obtained from the pupil luminance distribution, based on the light intensity distribution of the aerial image acquired in the third process, and the adjustment method further comprises:
  a process of acquiring a unit change amount of the index value for each unit pupil area when a luminance level of one unit pupil area changes only by a unit luminance level in the discrete data acquired in a preceding process;
  a process of acquiring discrete data modulated from the discrete data acquired in the preceding process by an adjusting technique using the unit change amounts of a plurality of the index values that have been acquired so as to make an index value obtained from the modulated discrete data approach a target index value; and
  a process of acquiring an index value obtained corresponding to the modulated discrete data that has been acquired, using the evaluation method, wherein
by repeatedly performing the process of acquiring the unit change amount of the index value for each unit pupil area, the process of acquiring the discrete data modulated and the process of acquiring the index value until a difference between the index value obtained corresponding to the modulated discrete data and the target index value falls within a permissible range, the pupil luminance distribution to be formed on the illumination pupil is adjusted.

45. An illumination optical system that illuminates an irradiation target surface by light from a light source, and supplies illumination light to an image-forming optical system that forms an image of a pattern placed on a first plane on a second plane, the system comprising:
  a pupil distribution measurement device that measures a pupil luminance distribution formed on an illumination pupil of the illumination optical system;
  a pupil adjustment device that adjusts the pupil luminance distribution formed on the illumination pupil; and
  a controller that controls the pupil adjustment device to adjust the pupil luminance distribution formed on the illumination pupil using a predetermined adjustment method, wherein
the adjustment method comprises:
  a process of adjusting the pupil luminance distribution formed on the illumination pupil of the illumination optical system based on a result of evaluating the pupil luminance distribution formed on the illumination pupil using a predetermined evaluation method, wherein
the evaluation method includes:
  preparing a variation table that shows a variation of an intensity distribution of the image of the pattern with respect to a change in a pupil luminance for each of a plurality of unit pupil areas, the preparing including a first process of acquiring, for each unit pupil area, a unit intensity distribution formed on the second plane by light of a unit luminance level supplied from each unit pupil area, the plurality of unit pupil areas being obtained by virtually dividing the illumination pupil;
  calculating, by using luminance for each of the plurality of unit pupil areas of the pupil luminance distribution subject to evaluation and the variation table, the intensity distribution of the image of the pattern that is formed on the second plane with light from the pupil luminance distribution subject to evaluation, the calculating including a second process of acquiring discrete data of a standard pupil luminance distribution, according to a three-dimensional model in which each area of the plurality of unit pupil areas has a luminance level expressed by a multiple of the unit luminance level, and a third process of acquiring a light intensity distribution of an aerial image formed on the second plane from the standard pupil luminance distribution, based on the plurality of the unit intensity distributions acquired for each unit pupil area in the first process and the discrete data of the standard pupil luminance distribution acquired in the second process;
  acquiring, by using the calculated intensity distribution of the image, an index value of image-forming property obtained according to the pupil luminance distribution subject to evaluation, the acquiring including a fourth process of acquiring an index value of image-forming property obtained from the standard pupil luminance distribution, based on the light intensity distribution of the aerial image acquired in the third process; and
  acquiring, for each unit pupil area, a unit change amount of the index value obtained when the luminance level of one unit pupil area changes only by a unit luminance level in the discrete data of the standard pupil luminance distribution.

46. The illumination optical system according to claim 45, wherein
the pupil distribution measurement device measures a light intensity distribution in a surface optically conjugate to the illumination pupil, based on light that has passed through the irradiation target surface.

47. The illumination optical system according to claim 45, wherein
the pupil distribution measurement device measures a light intensity distribution in a surface optically conjugate to the illumination pupil, based on light proceeding toward the irradiation target surface.

48. The illumination optical system according to claim 45, wherein
the pupil adjustment device has a spatial light modulator that has a plurality of optical elements arranged on a predetermined plane that are individually controlled and variably forms a pupil luminance distribution on the illumination pupil, and the controller controls the plurality of optical elements of the spatial light modulator.

49. The illumination optical system according to claim 48, wherein the spatial light modulator has the plurality of mirror elements arranged two-dimensionally in the predetermined plane, and a driving section that controls and drives an attitude of the plurality of mirror elements individually.

* * * * *